(12) United States Patent
Terada

(10) Patent No.: US 11,081,522 B2
(45) Date of Patent: Aug. 3, 2021

(54) WIRING LINE LAYOUT IN A SEMICONDUCTOR MEMORY DEVICE

(71) Applicant: SONY SEMICONDUCTOR SOLUTIONS CORPORATION, Kanagawa (JP)

(72) Inventor: Haruhiko Terada, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 16/615,243

(22) PCT Filed: Apr. 17, 2018

(86) PCT No.: PCT/JP2018/015799
§ 371 (c)(1),
(2) Date: Nov. 20, 2019

(87) PCT Pub. No.: WO2018/221044
PCT Pub. Date: Dec. 6, 2018

(65) Prior Publication Data
US 2020/0203426 A1    Jun. 25, 2020

(30) Foreign Application Priority Data

May 29, 2017    (JP) .............................. JP2017-105367

(51) Int. Cl.
*H01L 27/24*    (2006.01)
*G11C 5/02*    (2006.01)
(Continued)

(52) U.S. Cl.
CPC .......... *H01L 27/2436* (2013.01); *G11C 5/025* (2013.01); *G11C 5/06* (2013.01);
(Continued)

(58) Field of Classification Search
None
See application file for complete search history.

(56) References Cited

U.S. PATENT DOCUMENTS 5,567,270 A * 10/1996 Liu .................. H01L 21/76804
257/E21.578
2010/0038616 A1    2/2010 Nagashima et al.
(Continued)

FOREIGN PATENT DOCUMENTS

| CN | 106688097 A | 5/2017 |
| JP | 2010-045205 A | 2/2010 |

(Continued)

OTHER PUBLICATIONS

International Search Report and Written Opinion of PCT Application No. PCT/JP2018/015799, dated Jul. 3, 2018, 11 pages of ISRWO.

*Primary Examiner* — J. H. Hur
(74) *Attorney, Agent, or Firm* — Chip Law Group

(57) ABSTRACT

A semiconductor device includes a plurality of first selection lines extending in a first direction and disposed side by side in a second direction, the second direction intersecting with the first direction, a first metal wiring line formed in a layer above the first selection line layer, a first through wiring line penetrating an insulating layer formed on the first selection line layer, and coupling a first line of the plurality of first selection lines and the first metal wiring line to each other, a second through wiring line penetrating the first selection line layer, the second through wiring line having one end coupled to the first metal wiring line, a first storage element having a first terminal, and a second terminal coupled to the first line, and a first drive circuit coupled to another end of the second through wiring line, and drives the plurality of first selection lines.

7 Claims, 30 Drawing Sheets

(51) Int. Cl.
*G11C 5/06* (2006.01)
*G11C 13/00* (2006.01)
*H01L 45/00* (2006.01)
*H01L 27/06* (2006.01)

(52) U.S. Cl.
CPC ...... *G11C 13/0002* (2013.01); *H01L 27/2427* (2013.01); *H01L 45/04* (2013.01); *H01L 27/0688* (2013.01)

(56) References Cited

U.S. PATENT DOCUMENTS

| | | |
|---|---|---|
| 2011/0204309 A1 | 8/2011 | Nitta |
| 2014/0239512 A1* | 8/2014 | Pellizzer ............... H01L 23/528 257/776 |
| 2016/0180929 A1* | 6/2016 | Kang .................. G11C 11/1659 365/63 |
| 2017/0294375 A1 | 10/2017 | Terada et al. |
| 2018/0175108 A1* | 6/2018 | Terada .................. H01L 45/122 |
| 2020/0020411 A1* | 1/2020 | Terada ..................... G11C 8/10 |

FOREIGN PATENT DOCUMENTS

| | | |
|---|---|---|
| JP | 2011-176226 A | 9/2011 |
| WO | 2016/047254 A1 | 3/2016 |

\* cited by examiner

[FIG. 1]
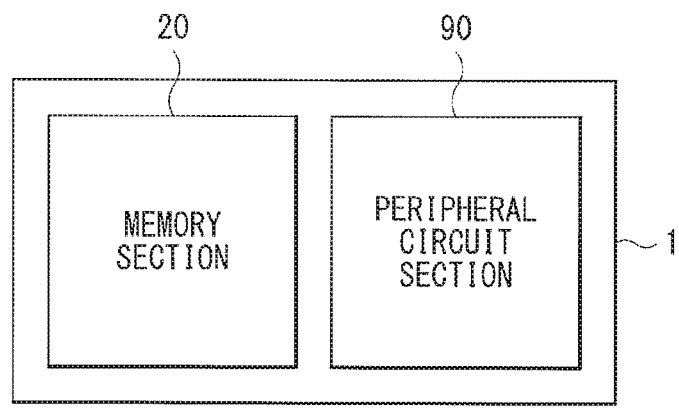

[FIG. 2]
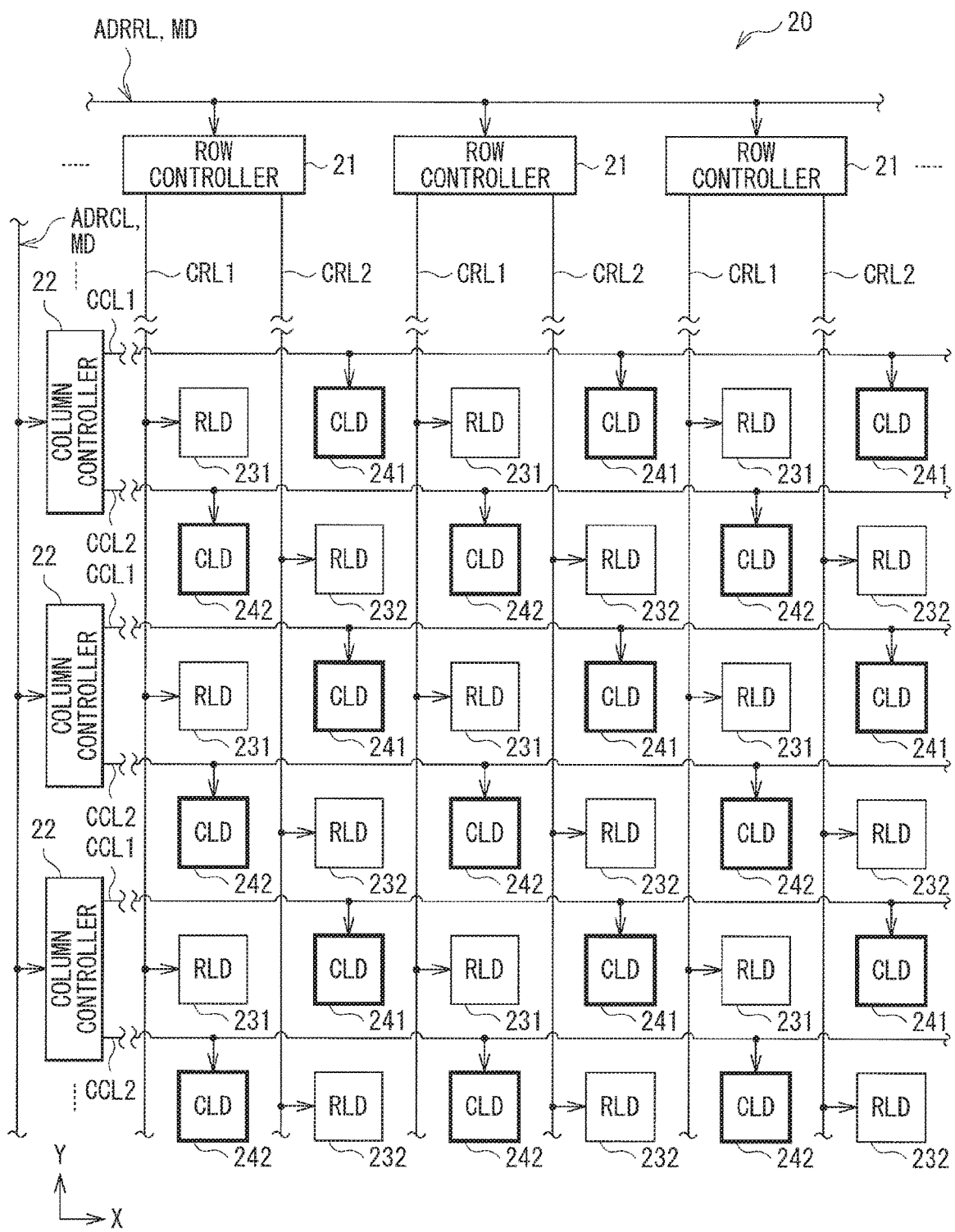

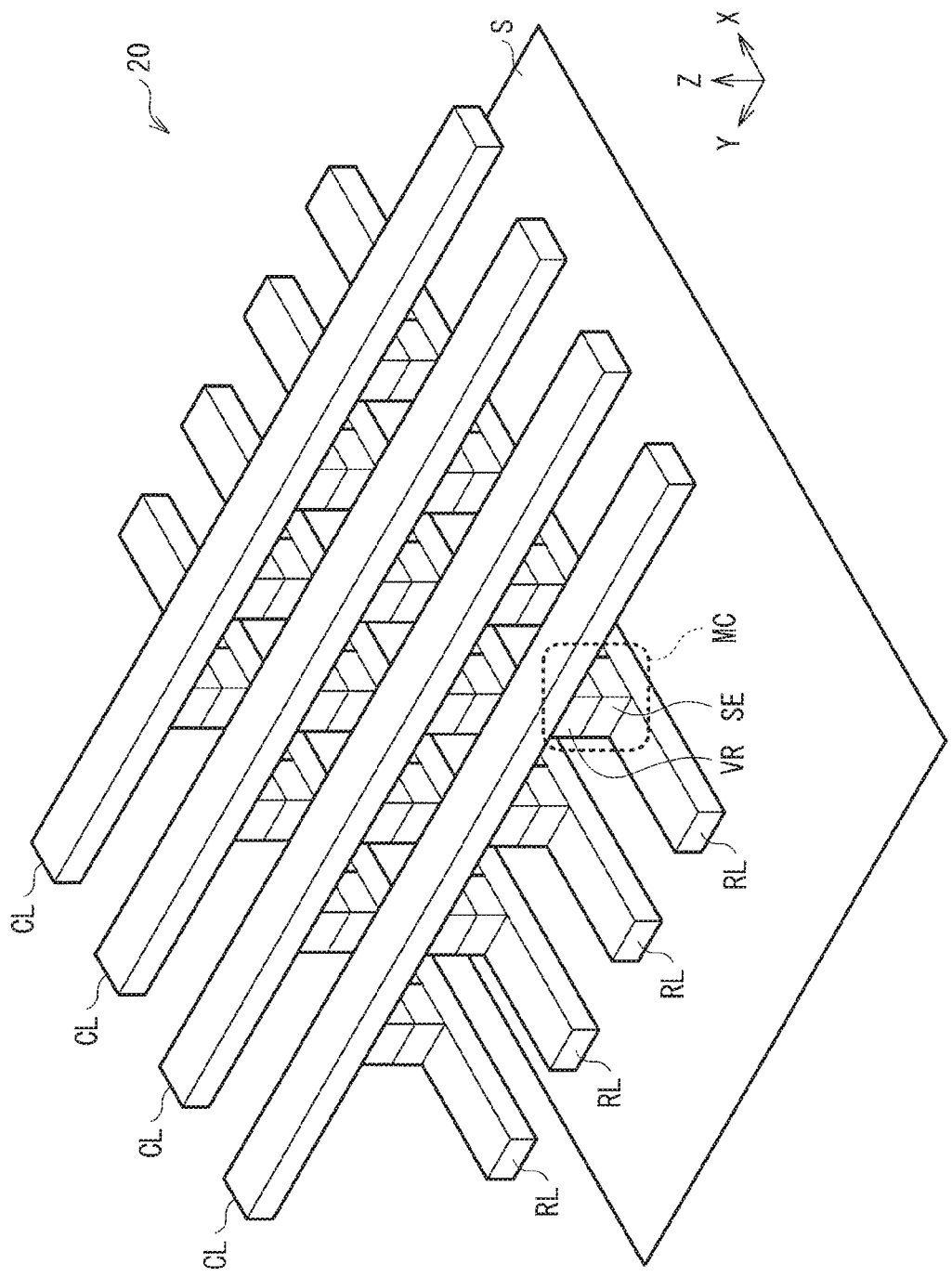
[FIG. 3]

[FIG. 4]
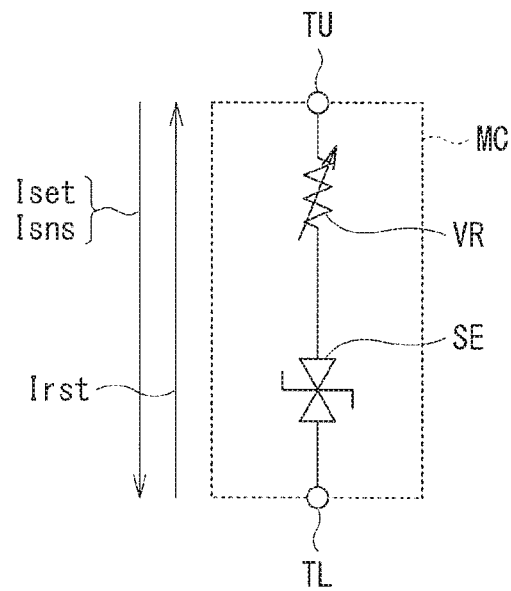
[FIG. 5]
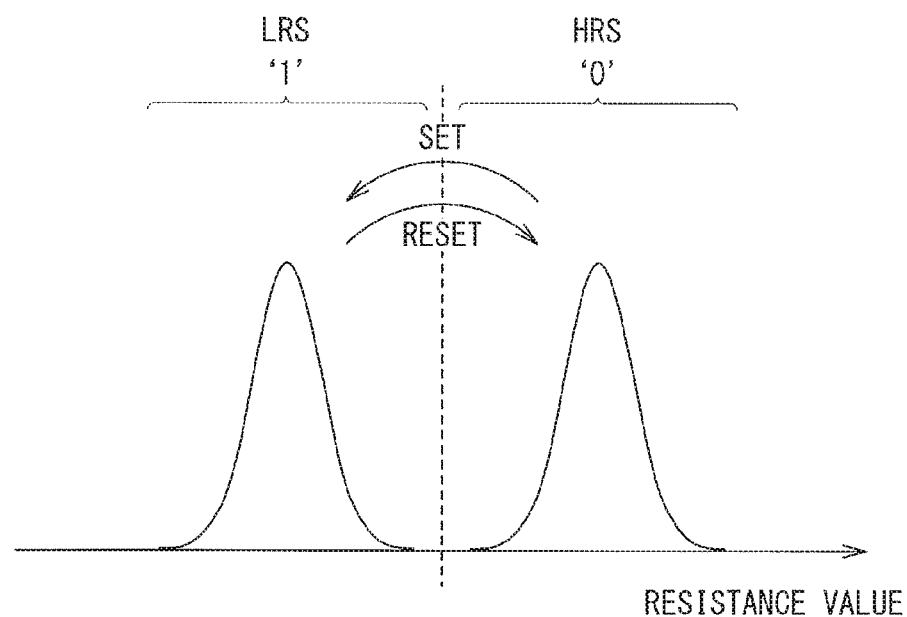

[FIG. 6]
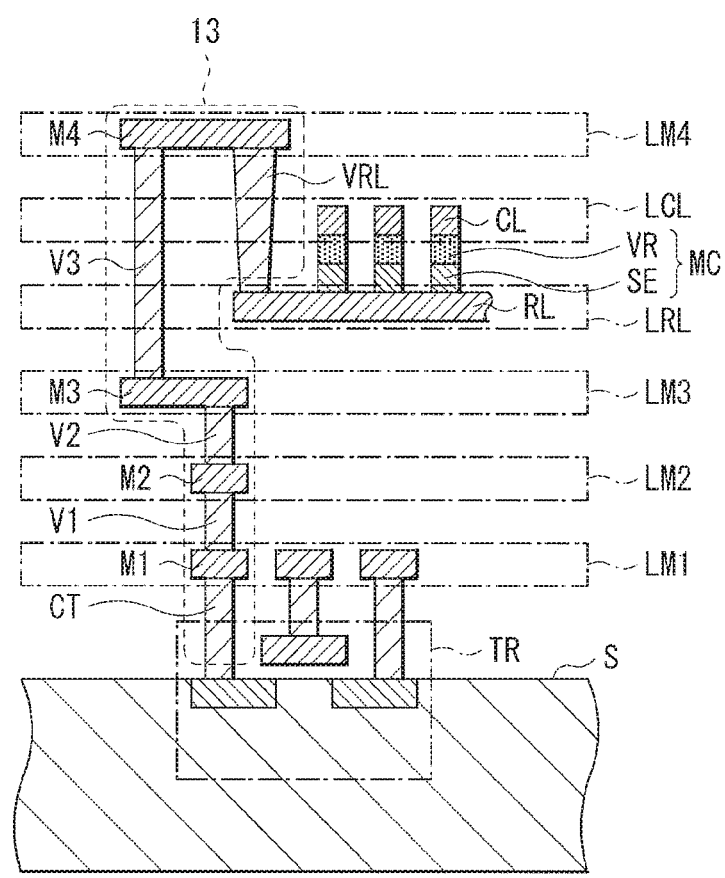

[FIG. 7]
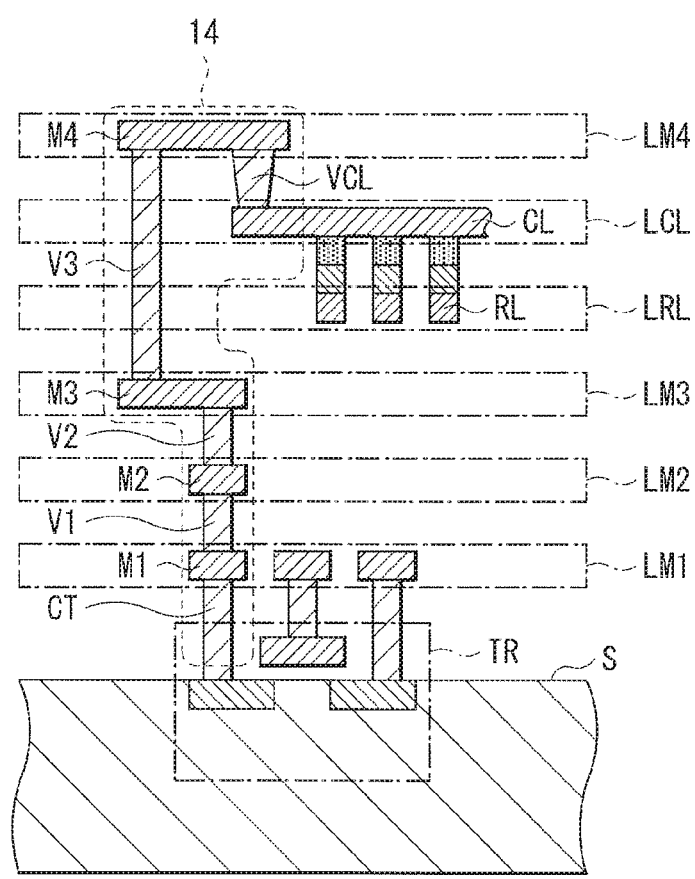

[FIG. 8]
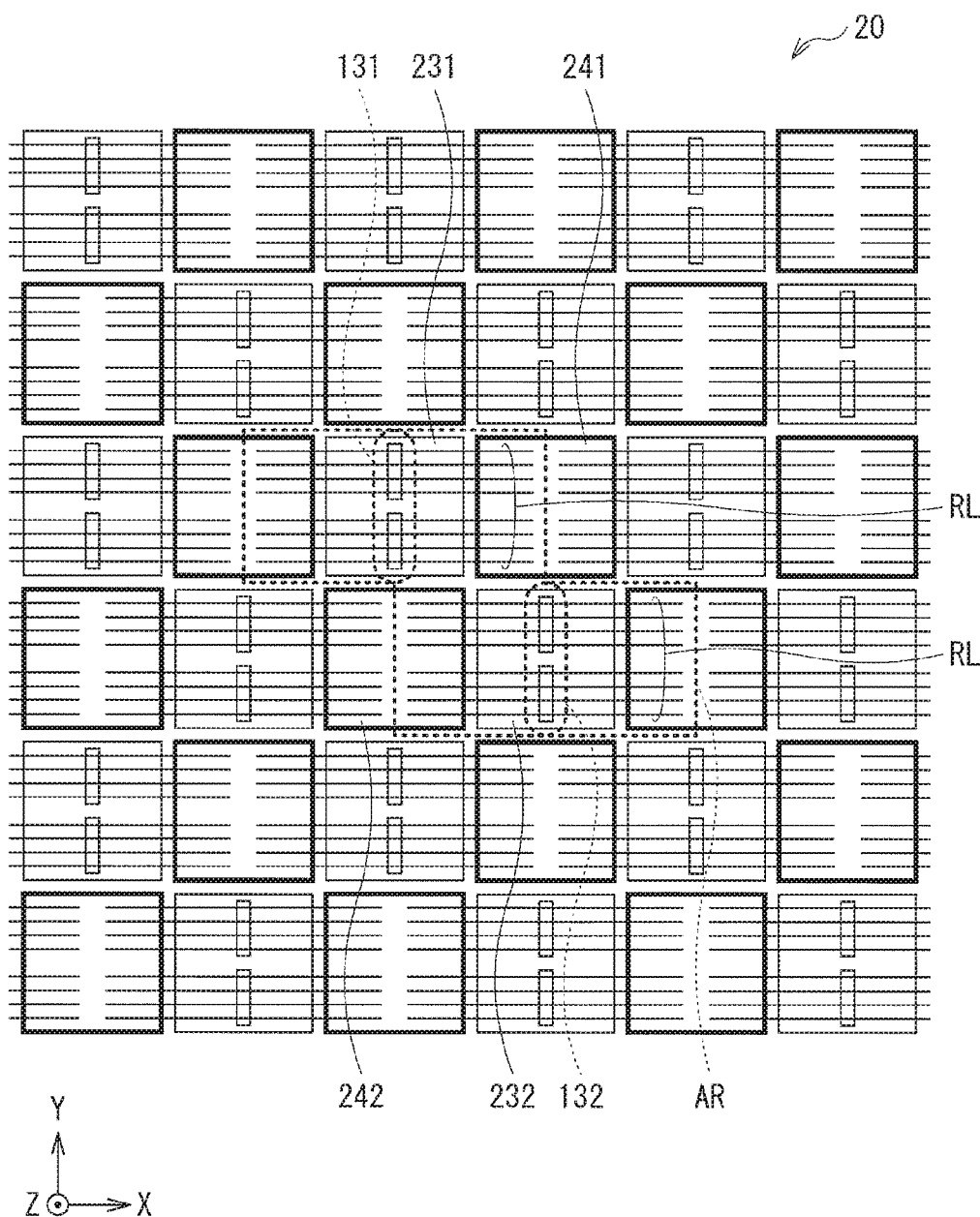

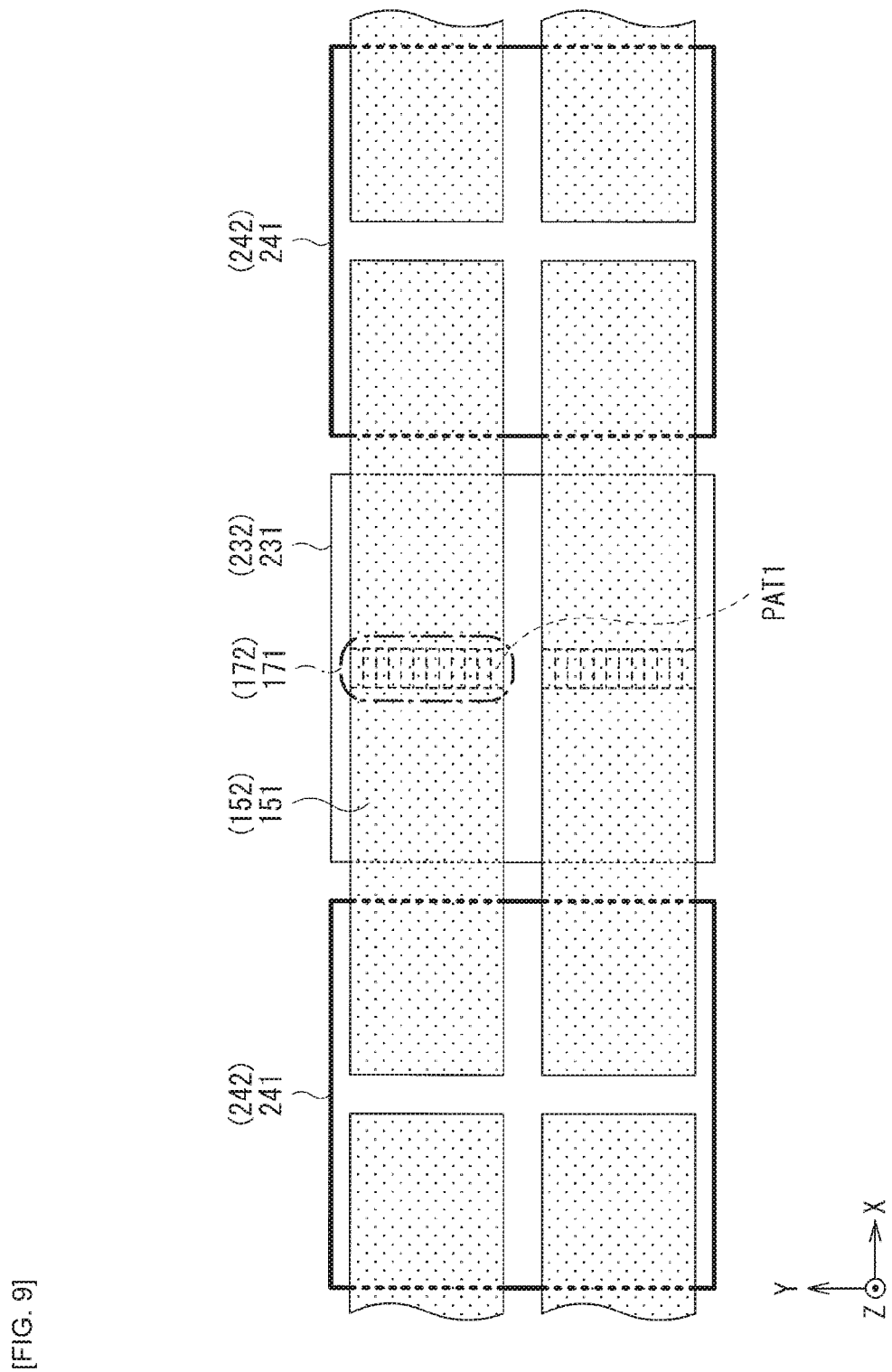

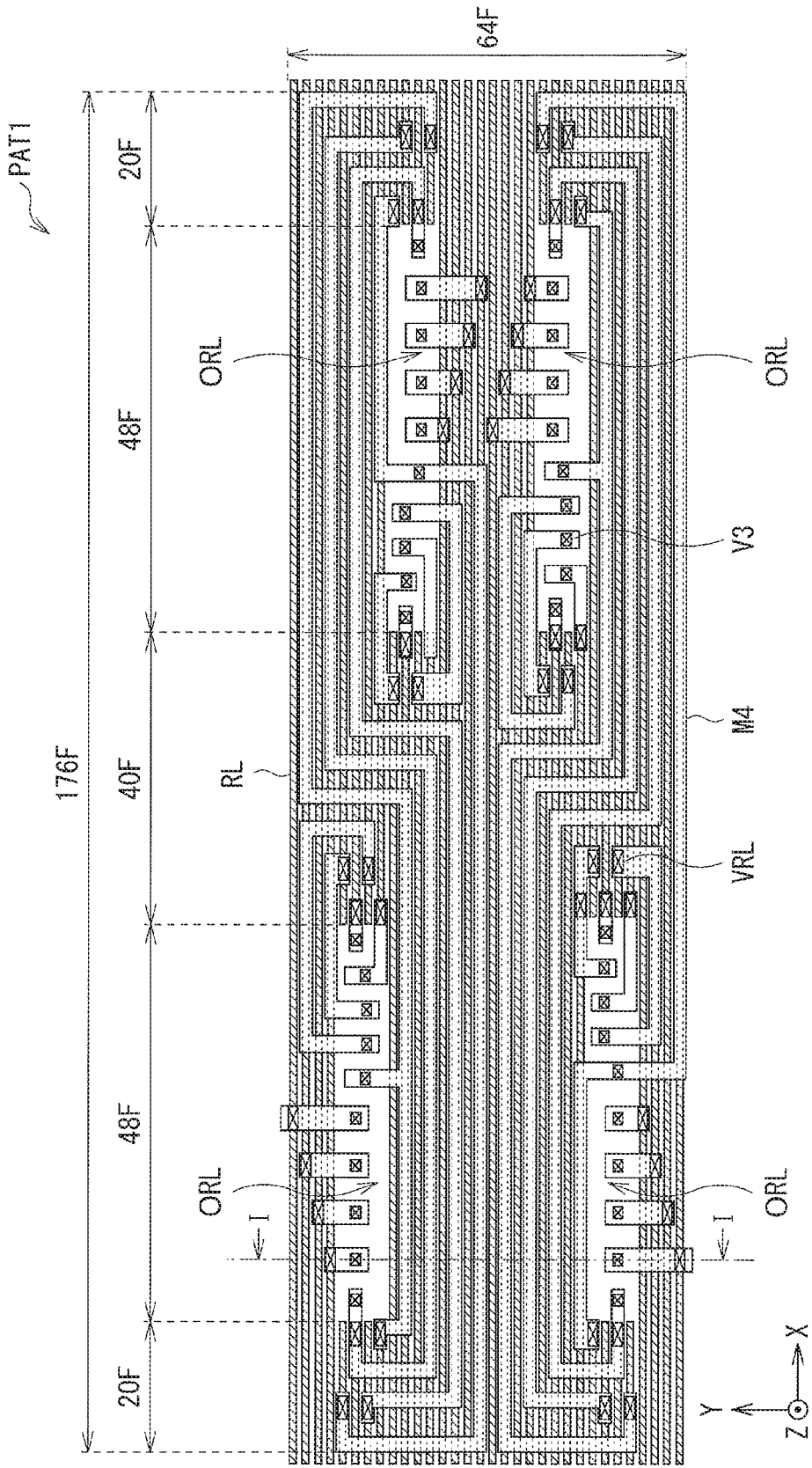
[FIG. 10]

[FIG. 11]
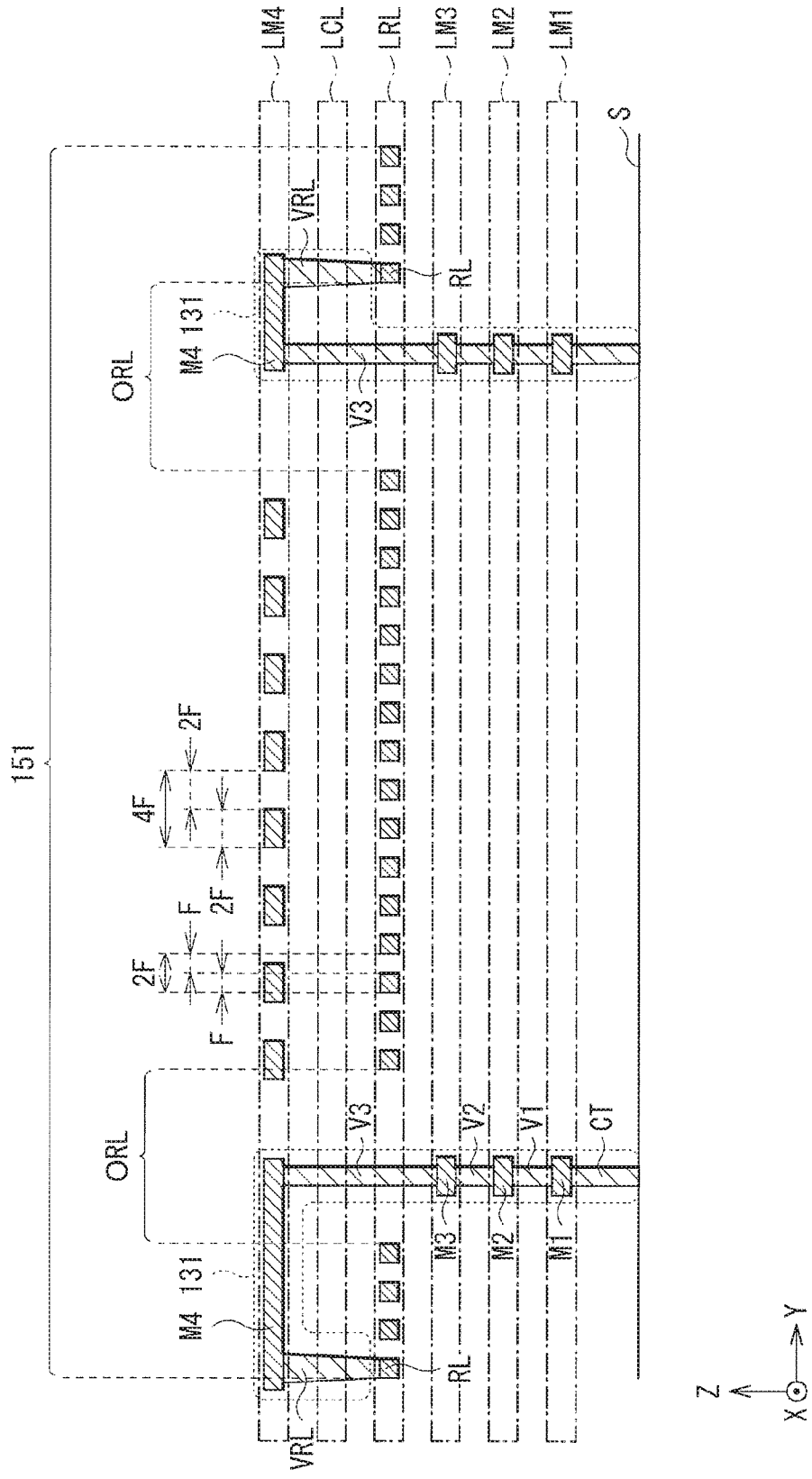

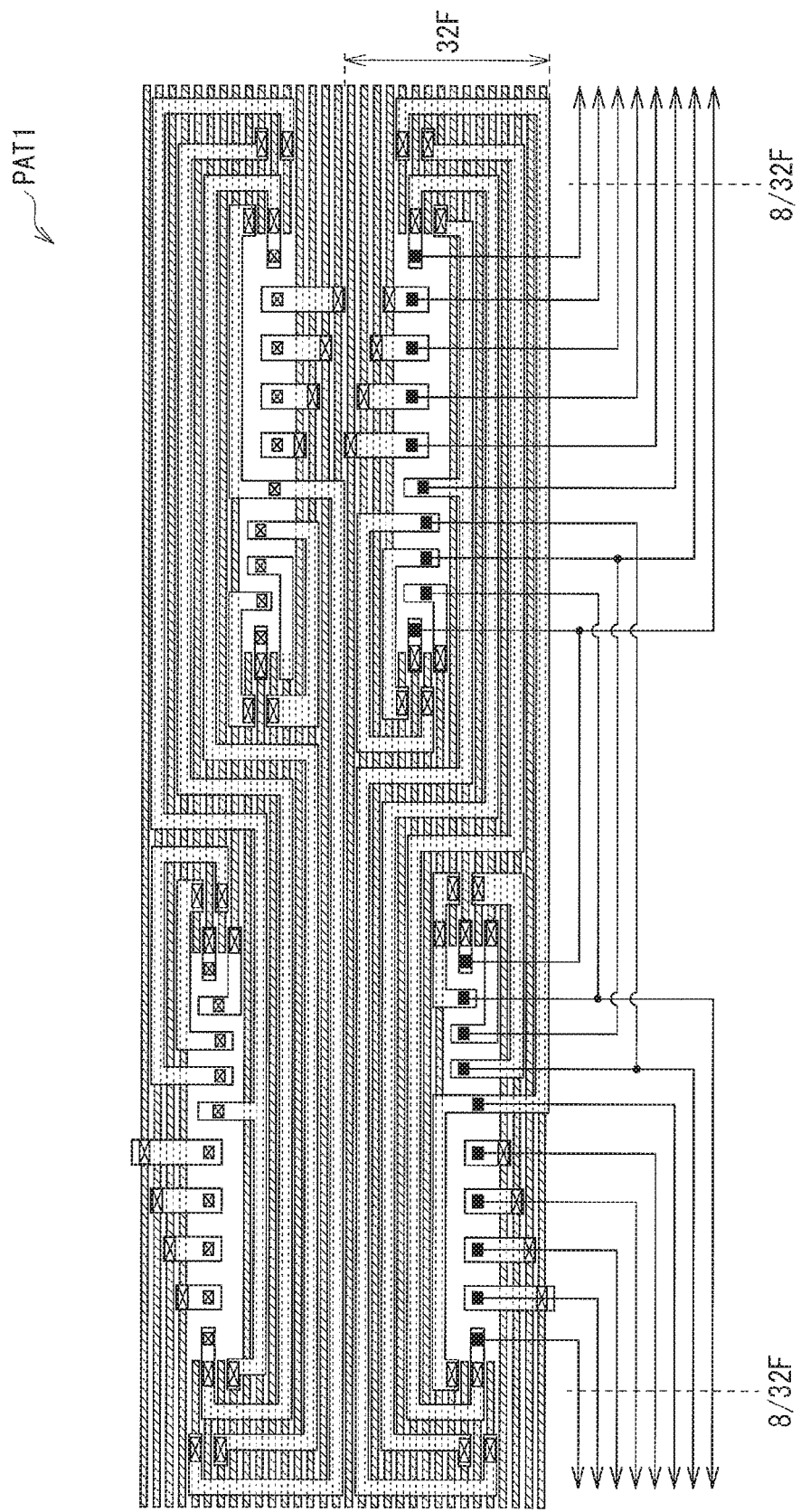

[FIG. 13]
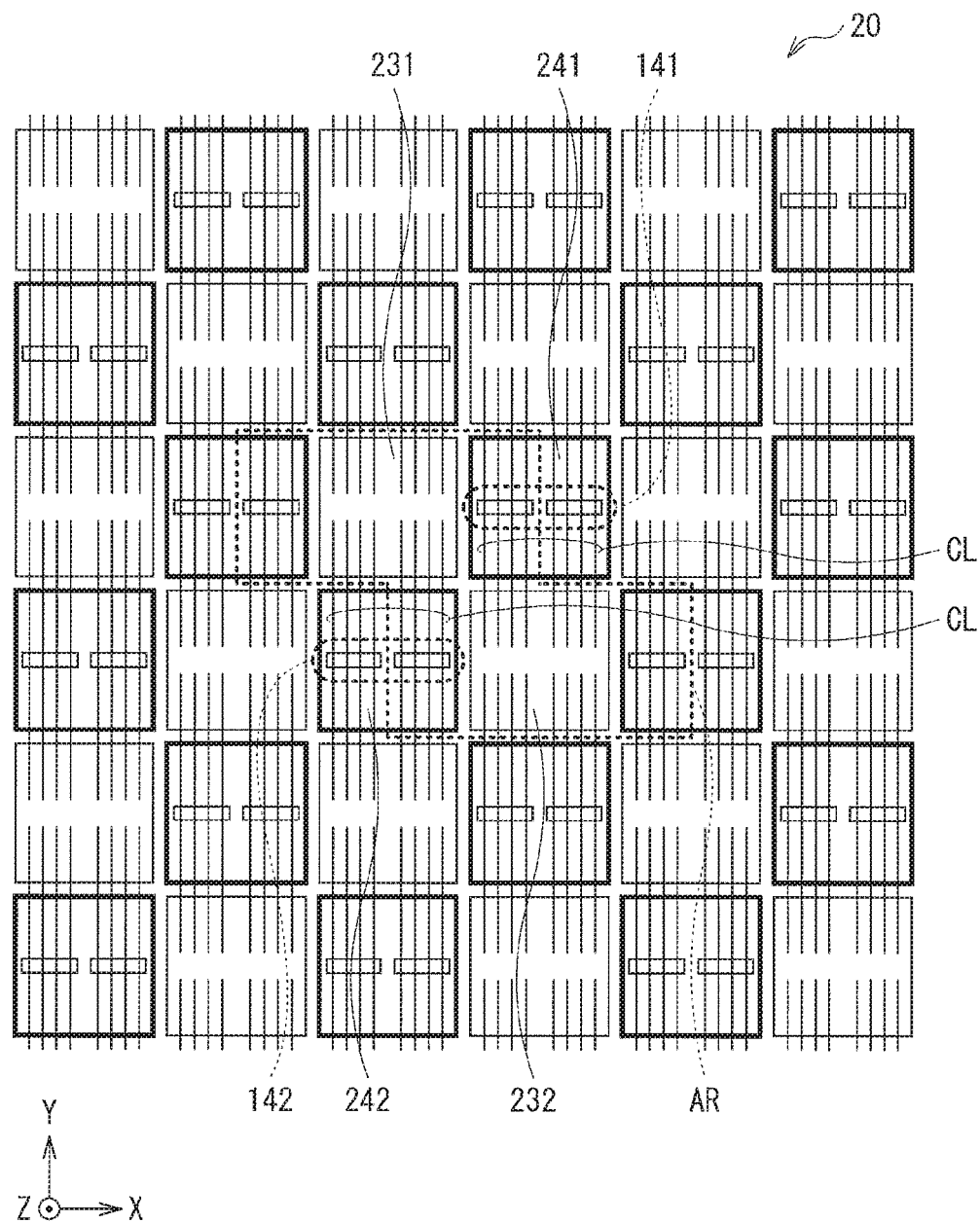

[FIG. 14]
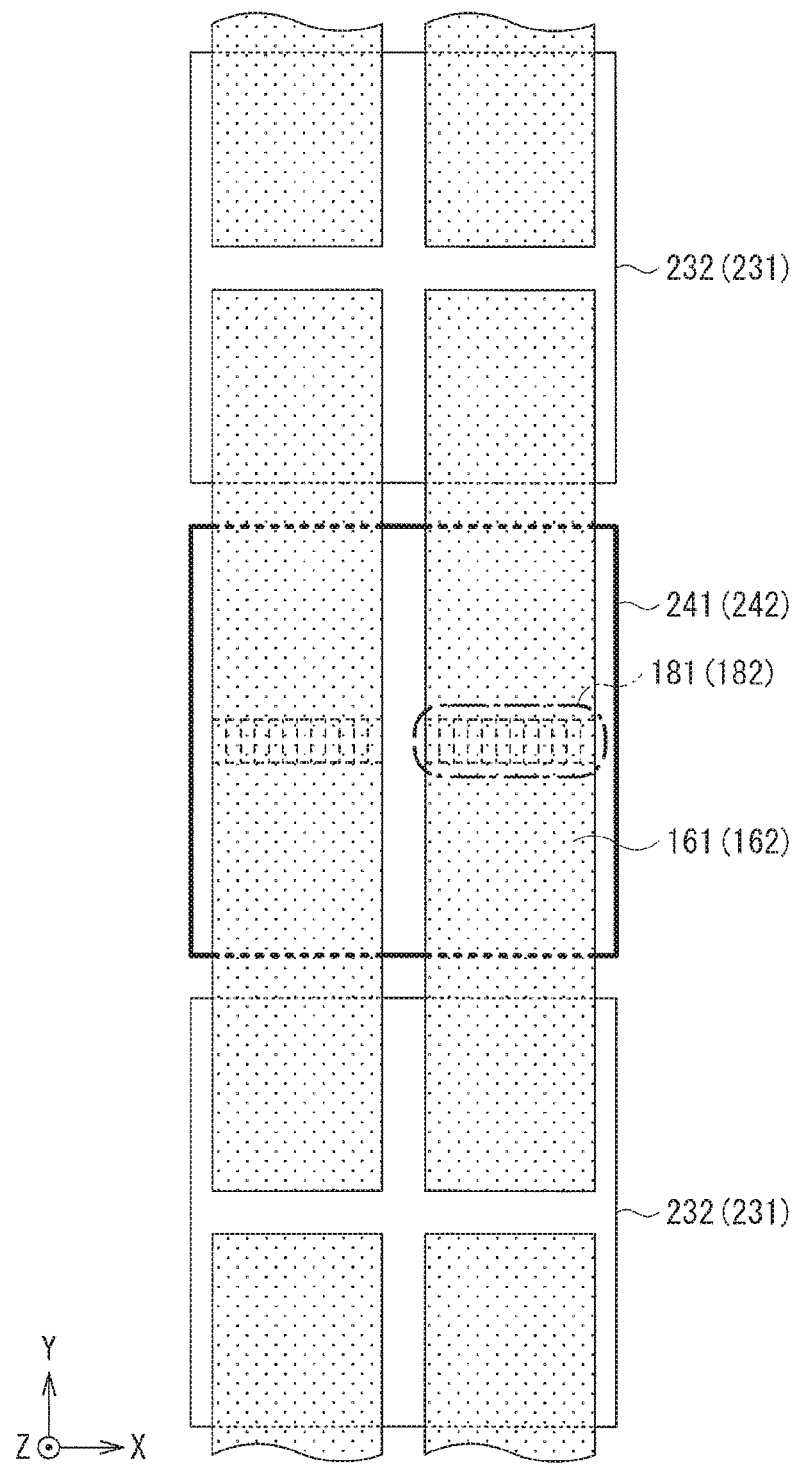

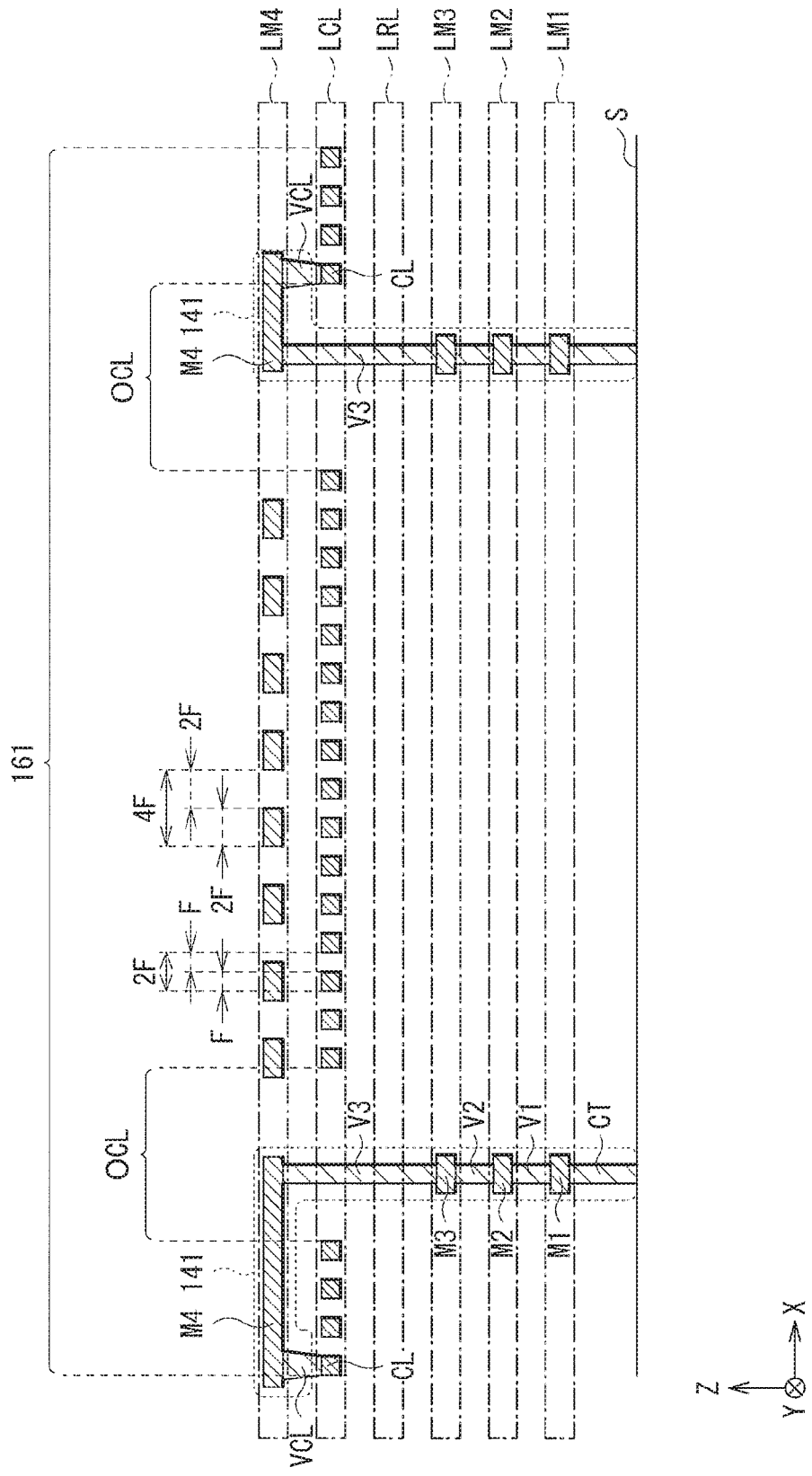
[FIG. 15]

[FIG. 16]
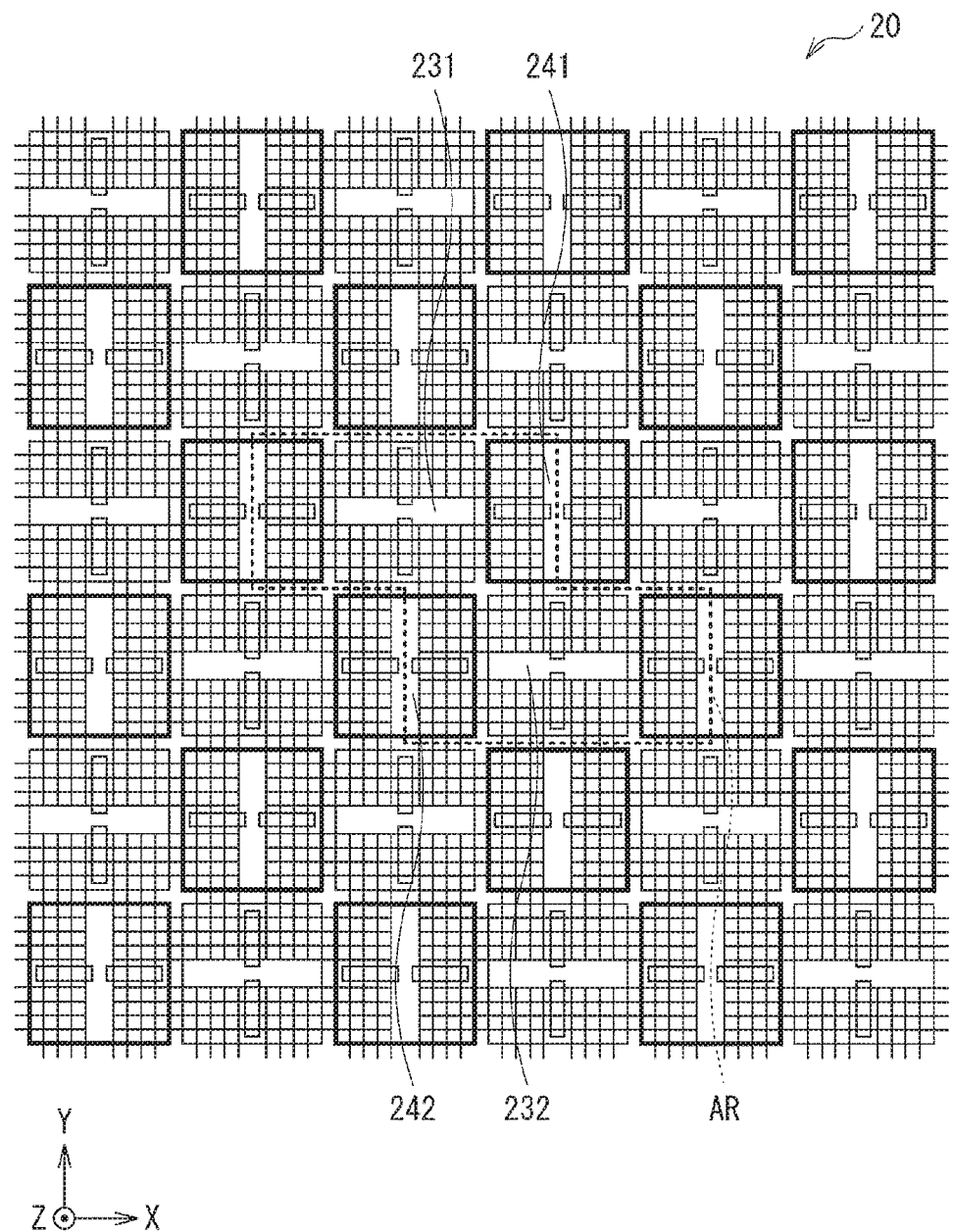

[FIG. 17]
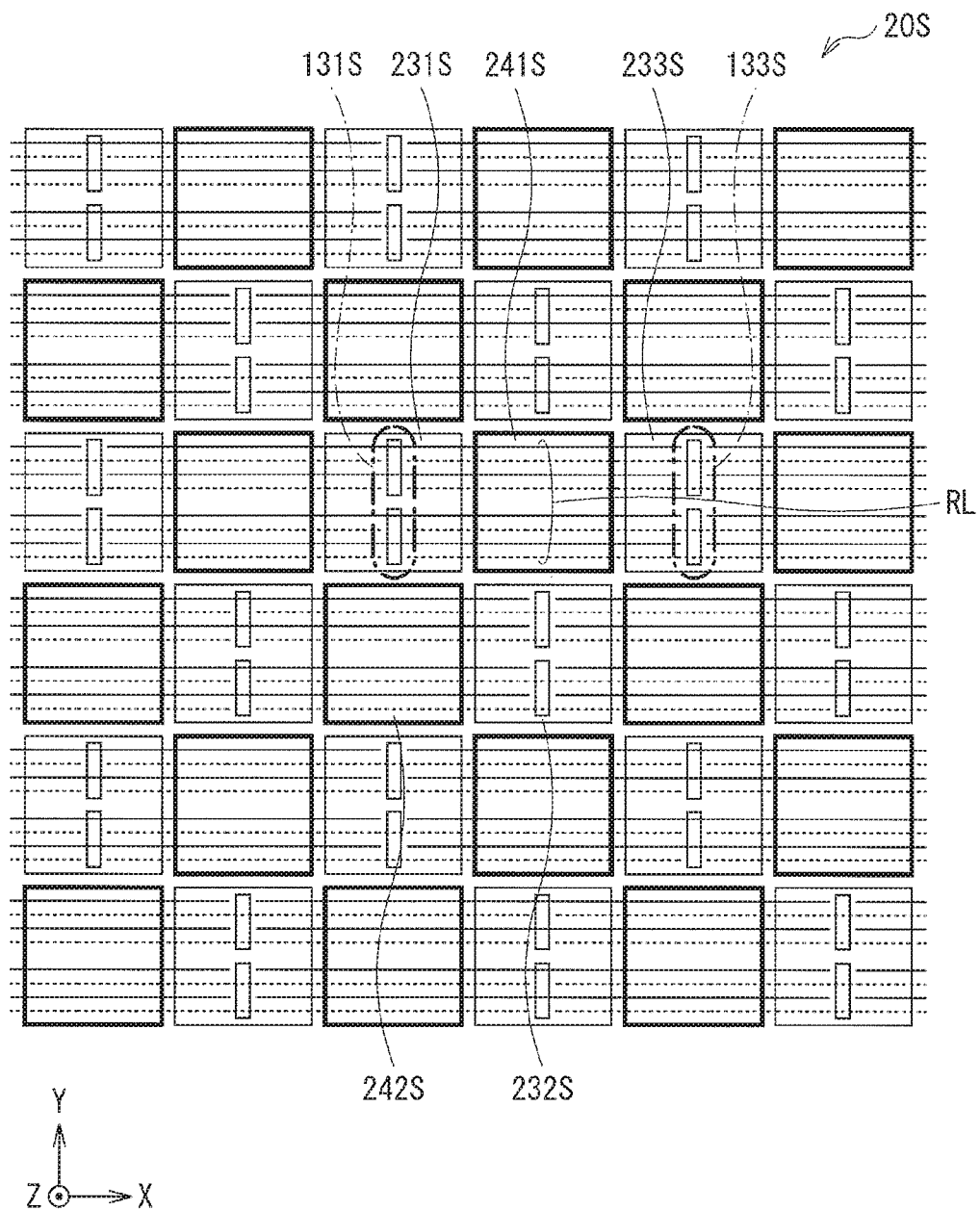

[FIG. 18]
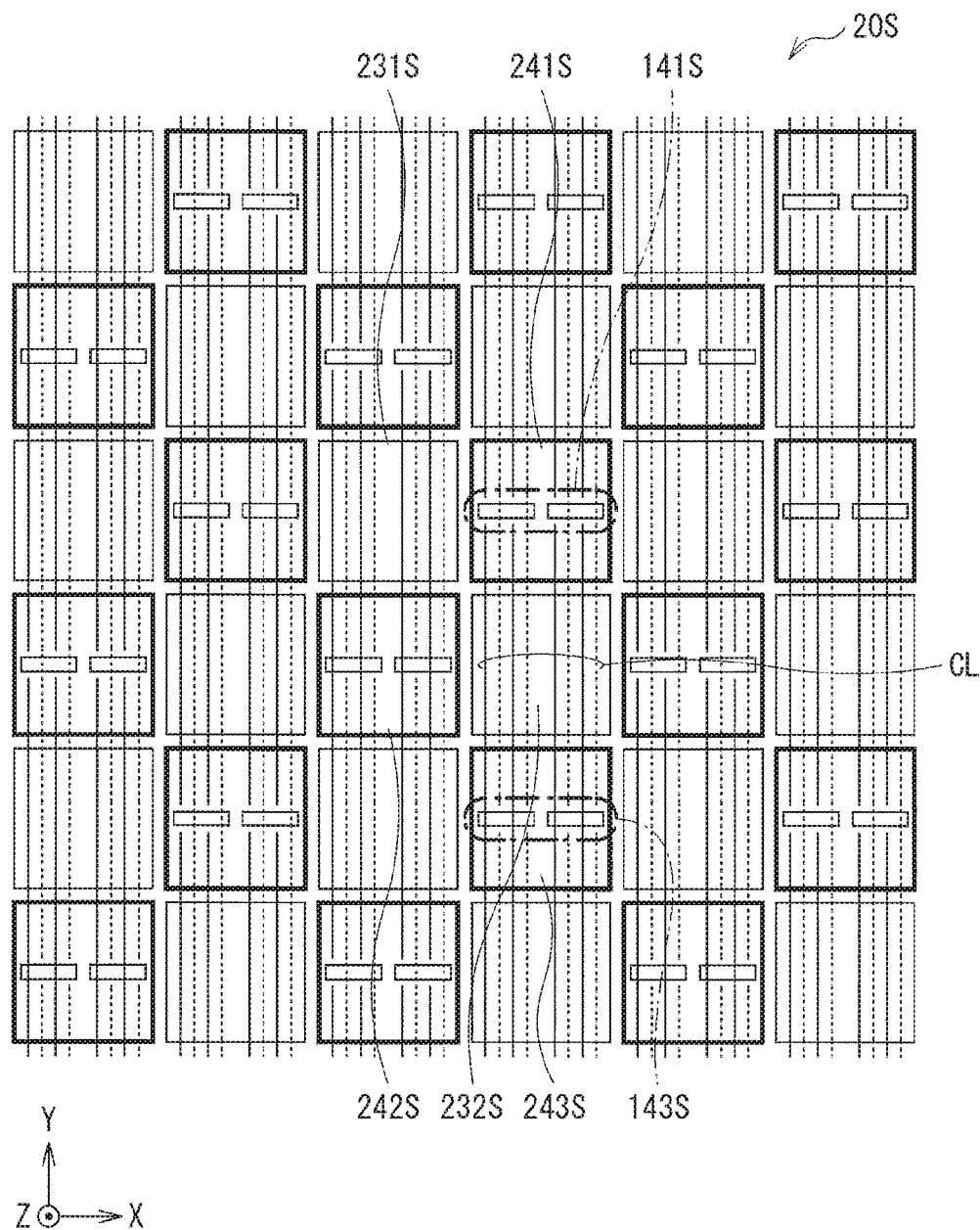

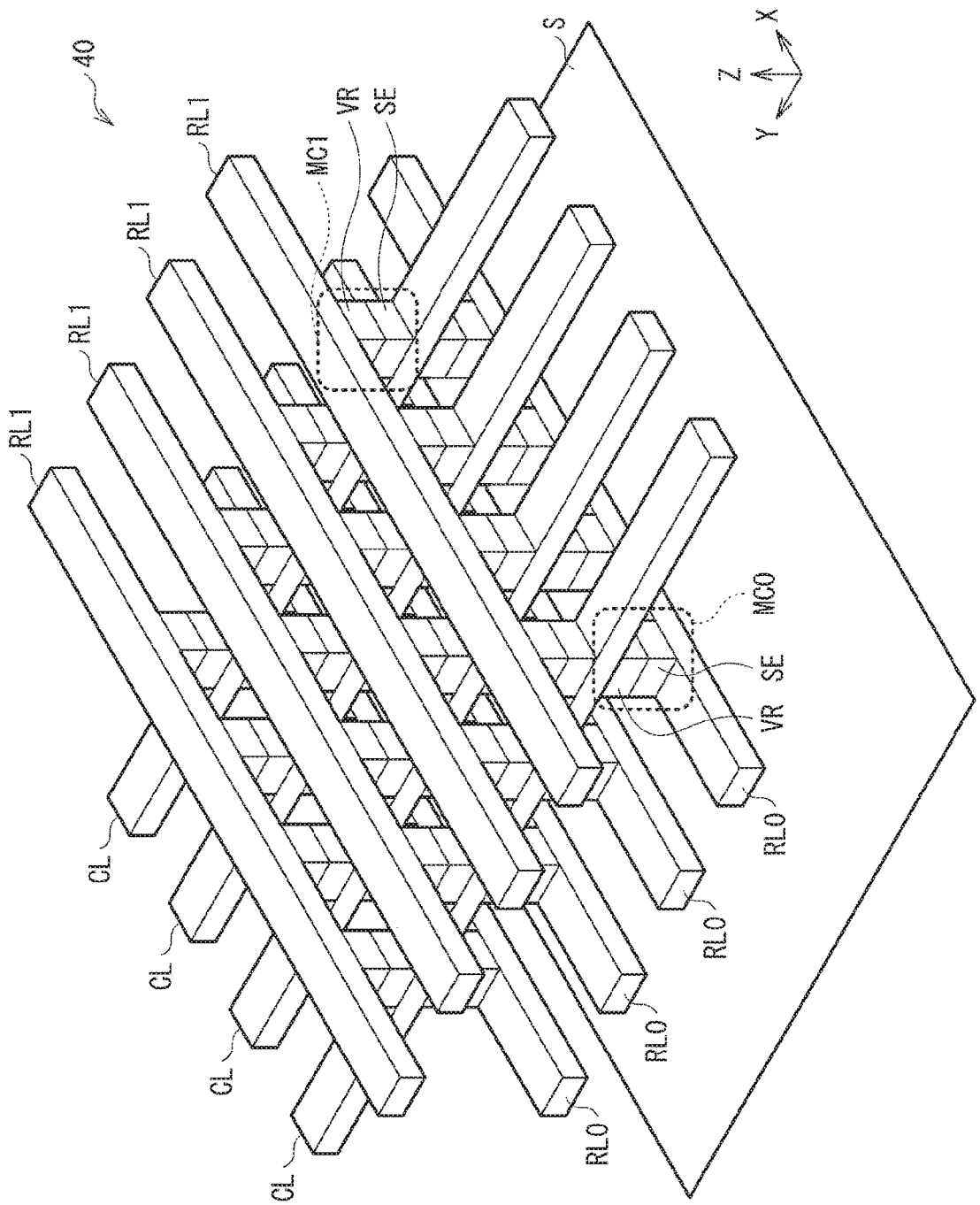
[FIG. 19]

[FIG. 20]
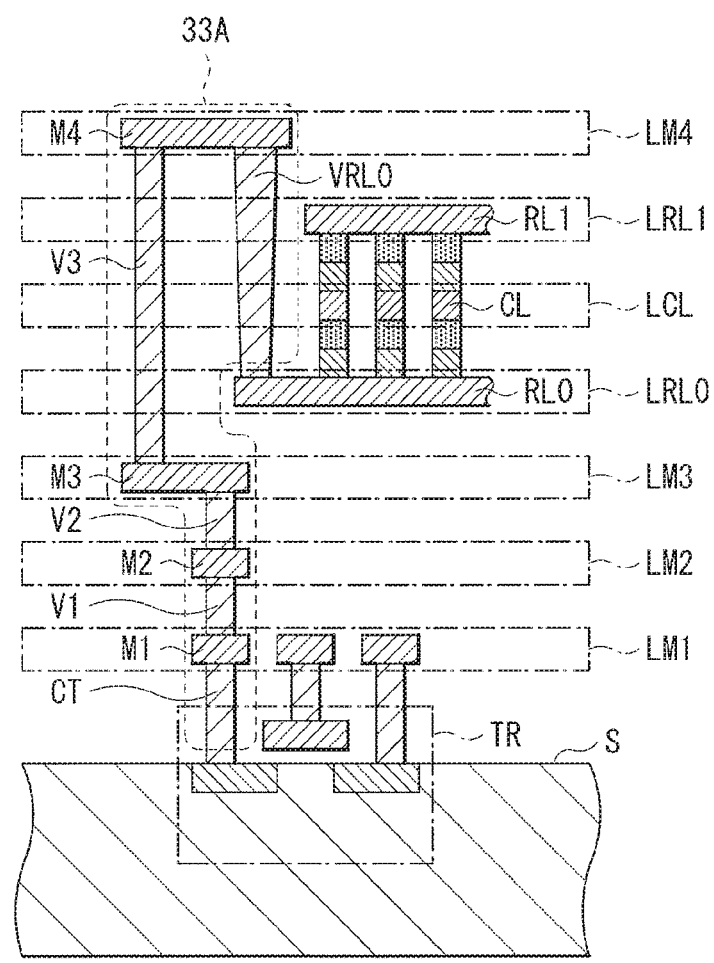

[FIG. 21]
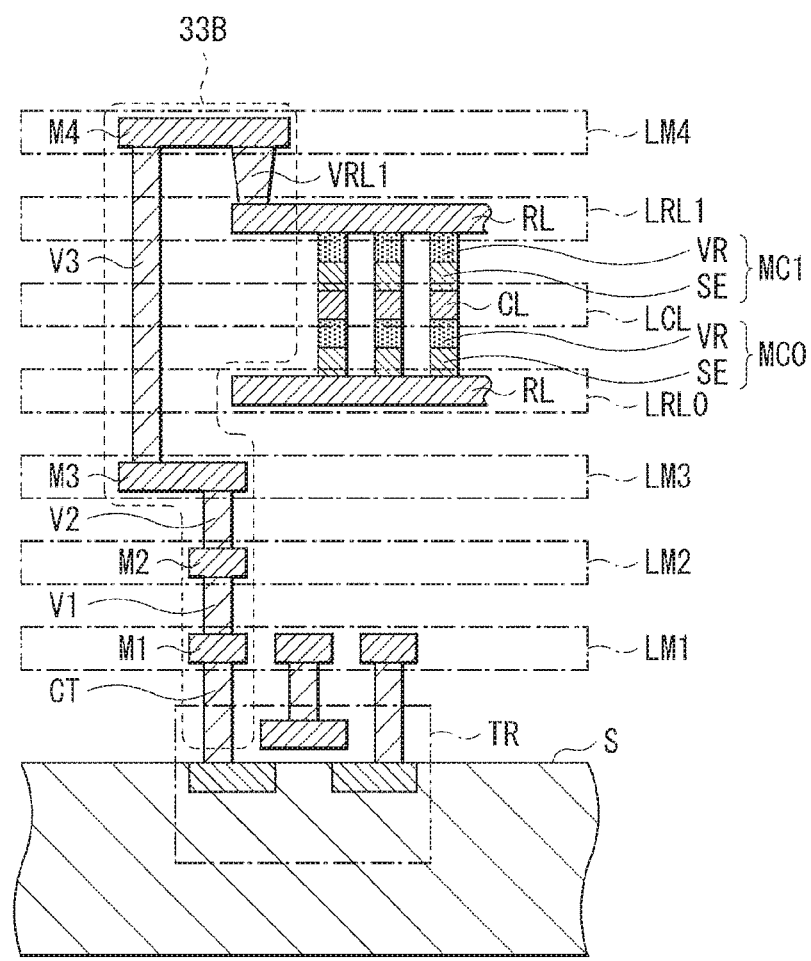

[FIG. 22]
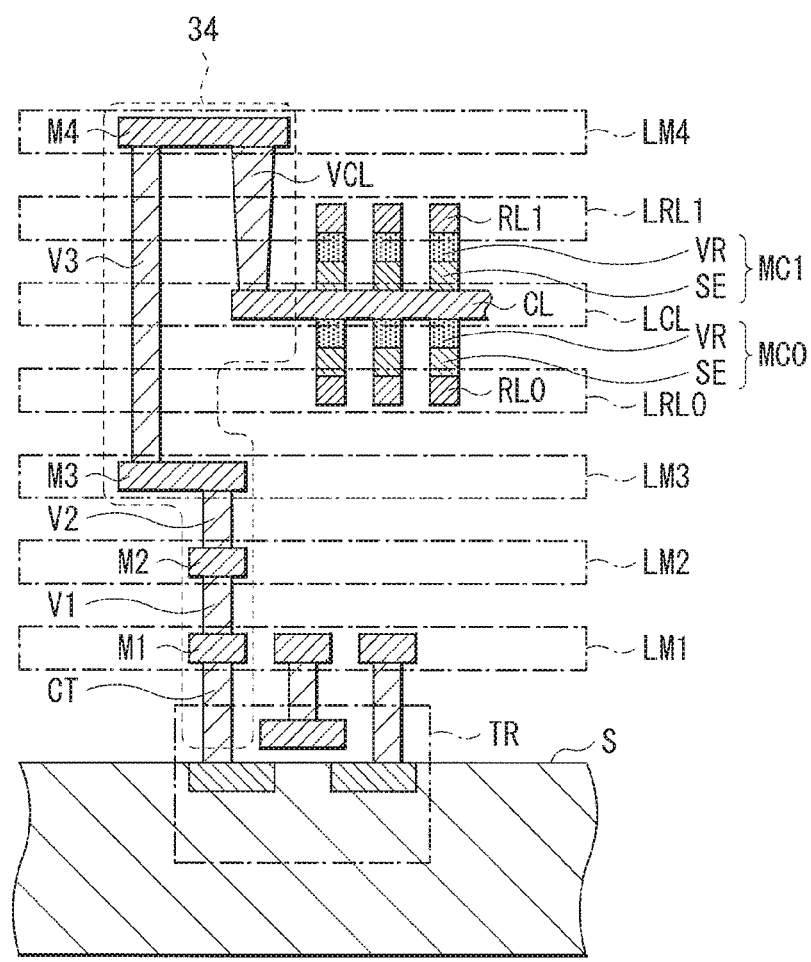

[FIG. 23]
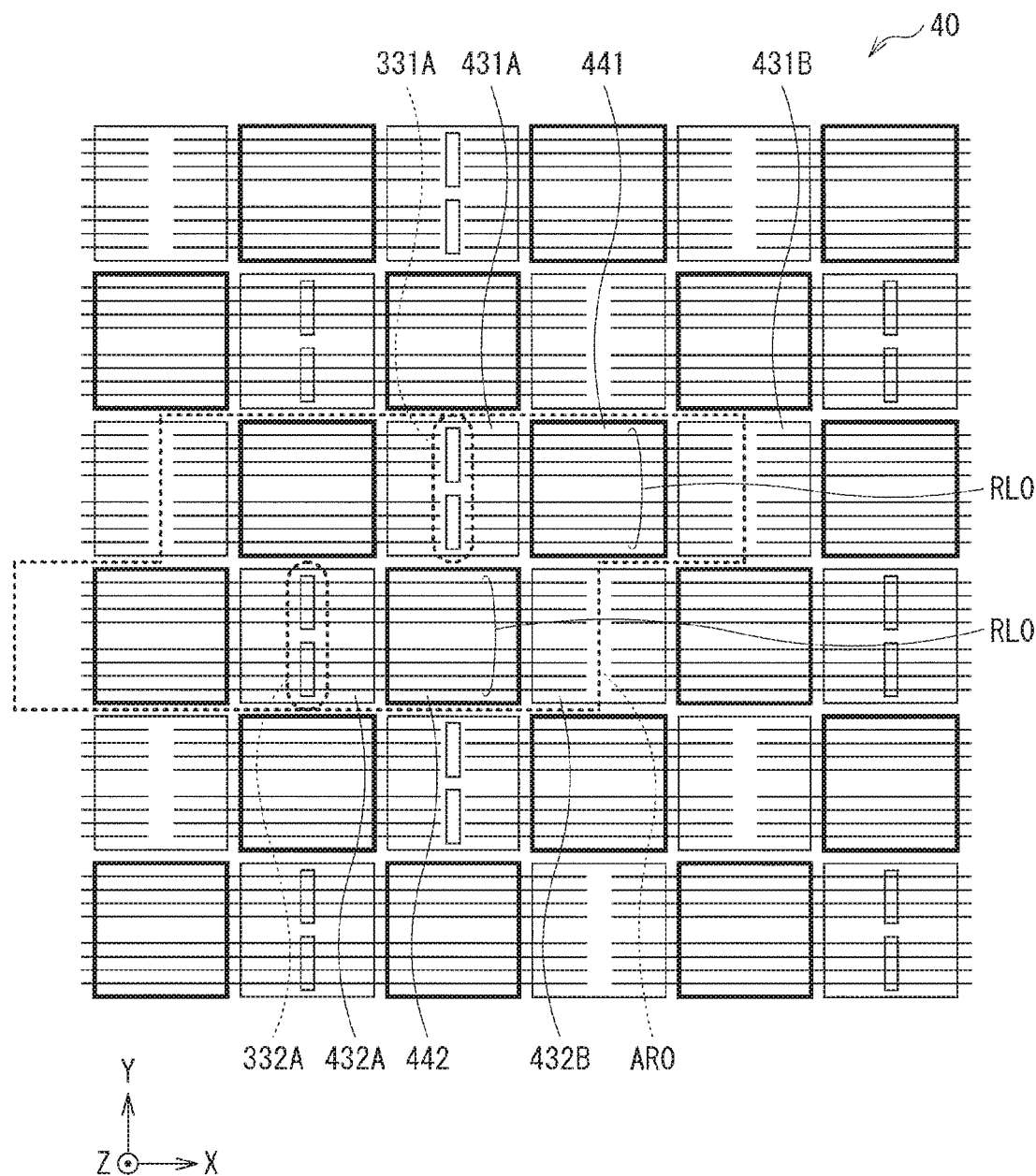

[FIG. 24]
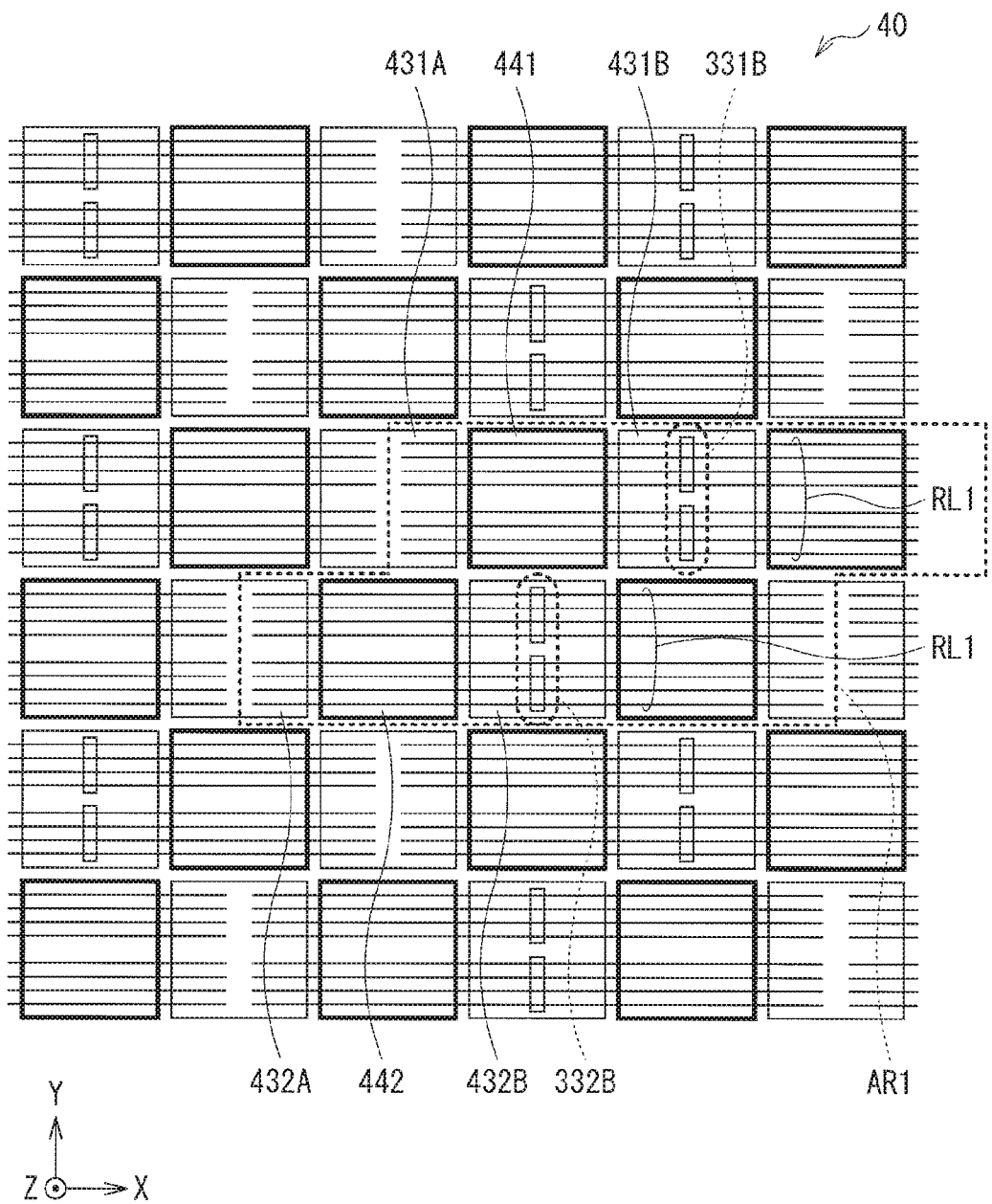

[FIG. 25]
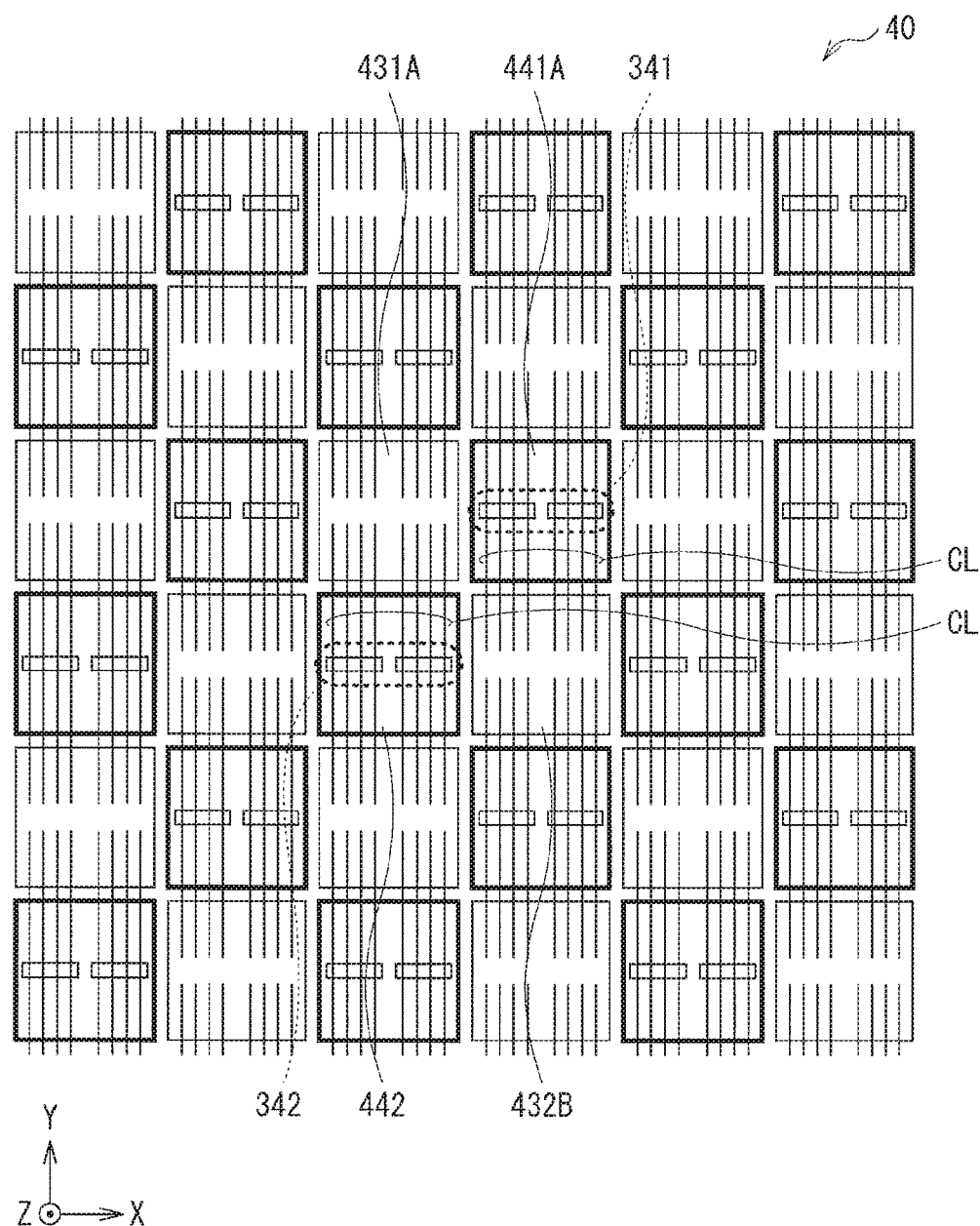

[FIG. 26]
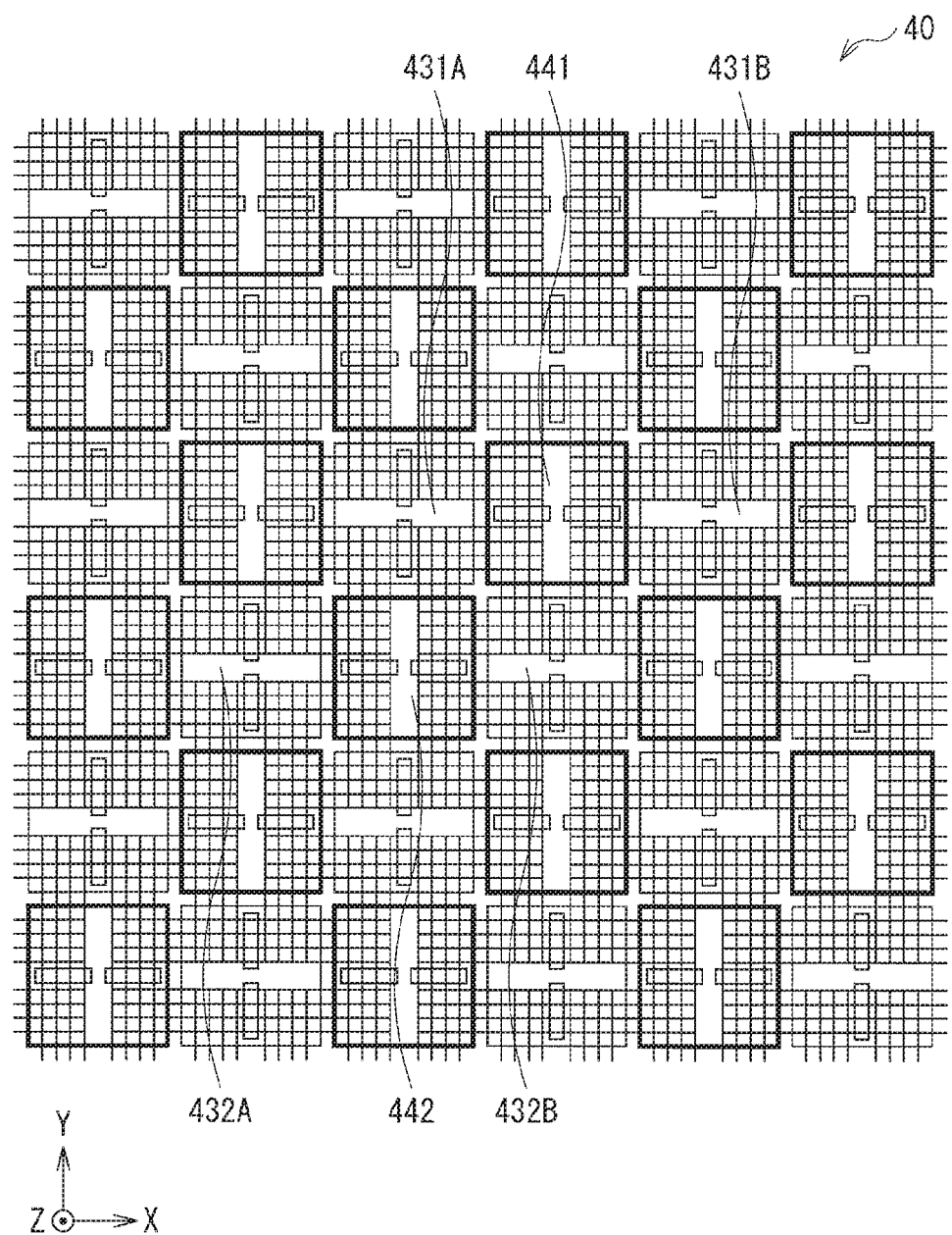

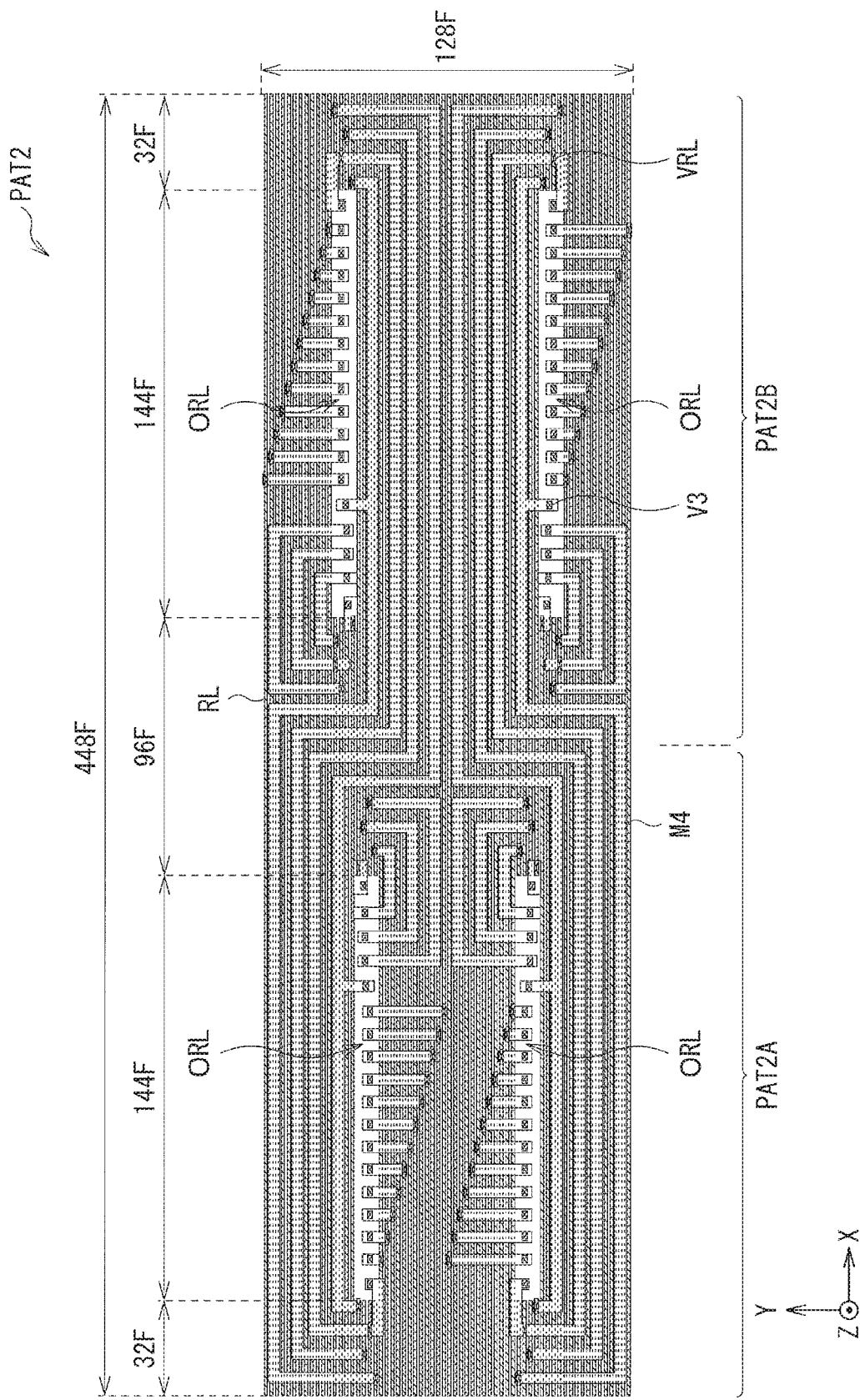
[FIG. 27]

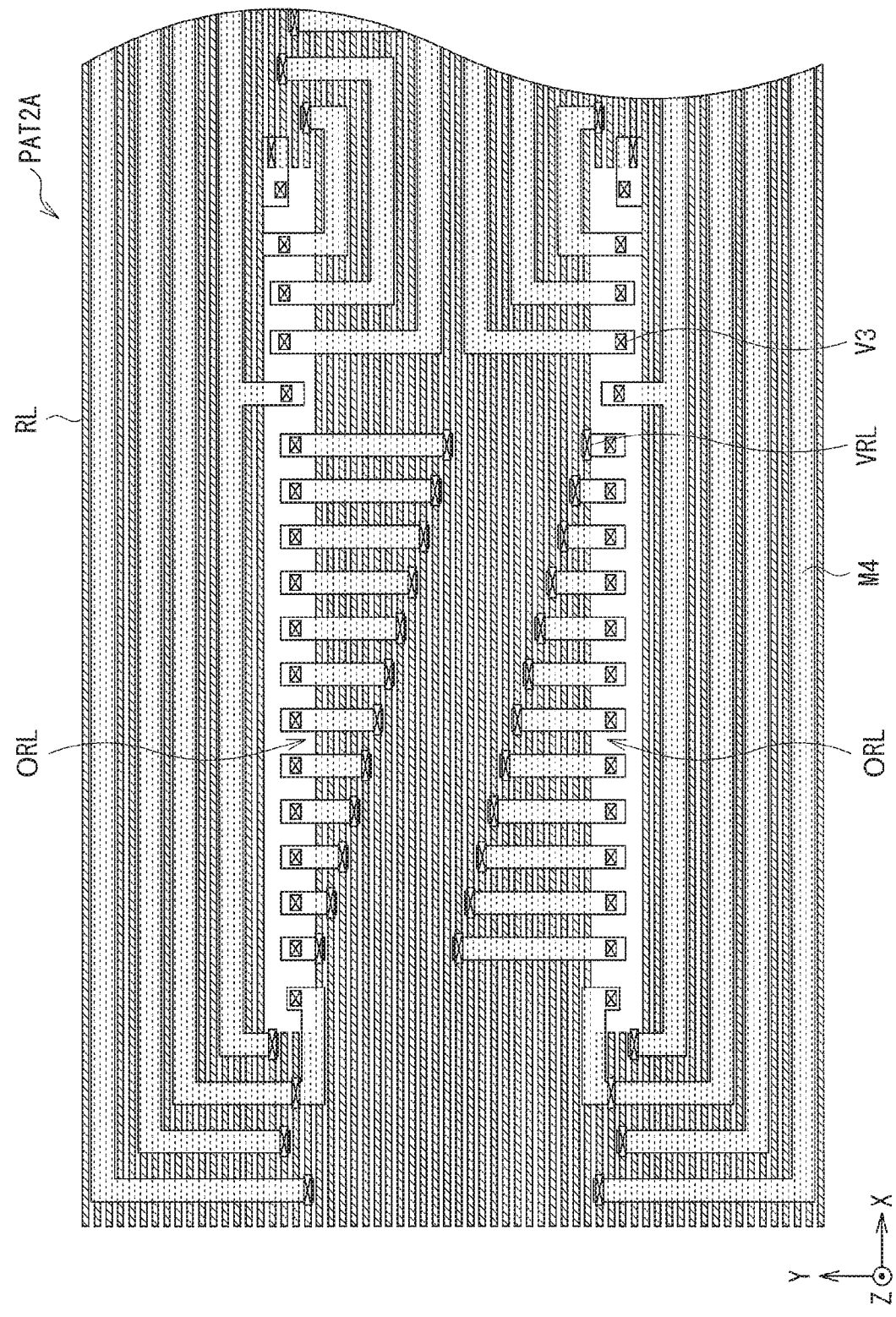
[FIG. 28]

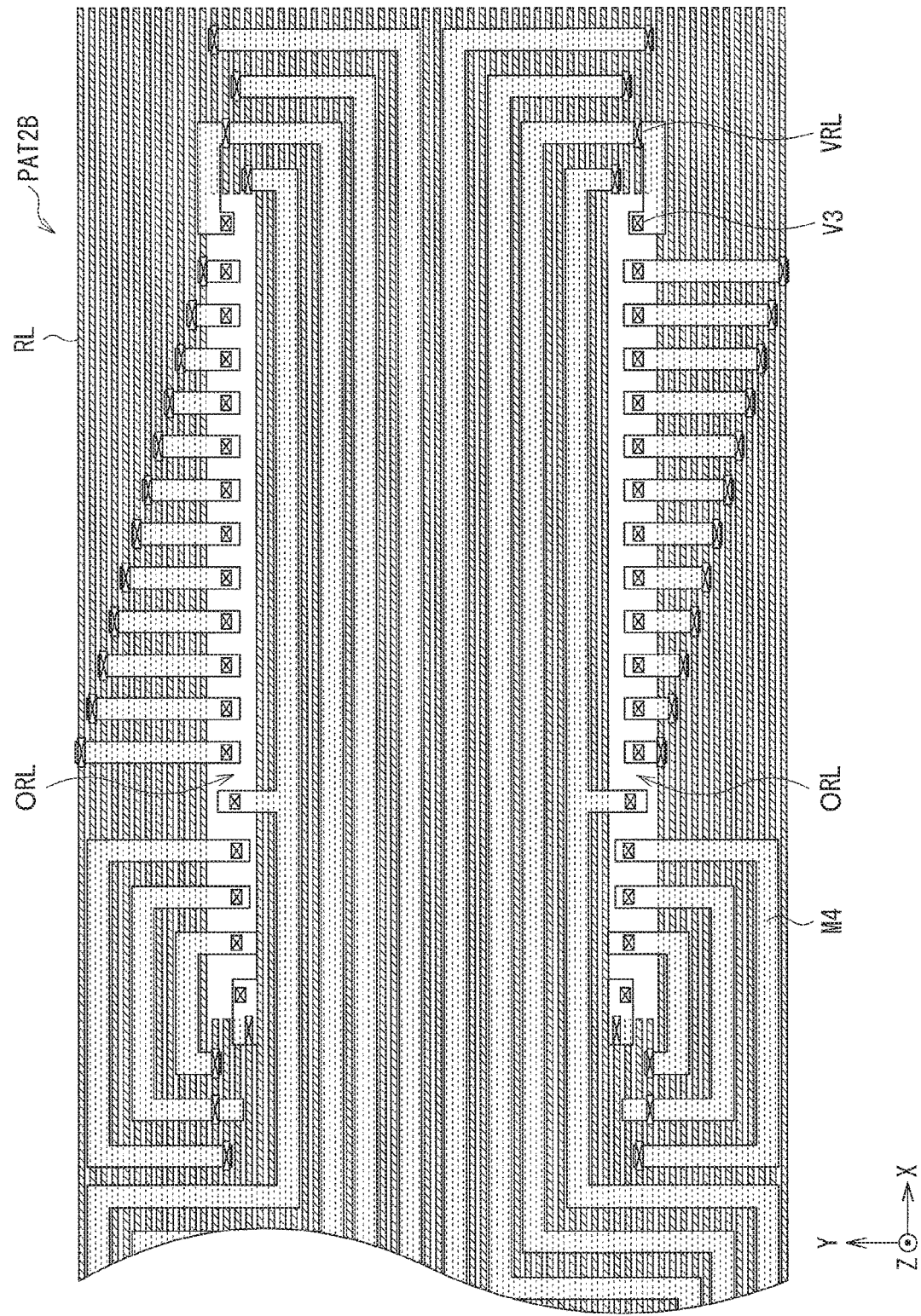
[FIG. 29]

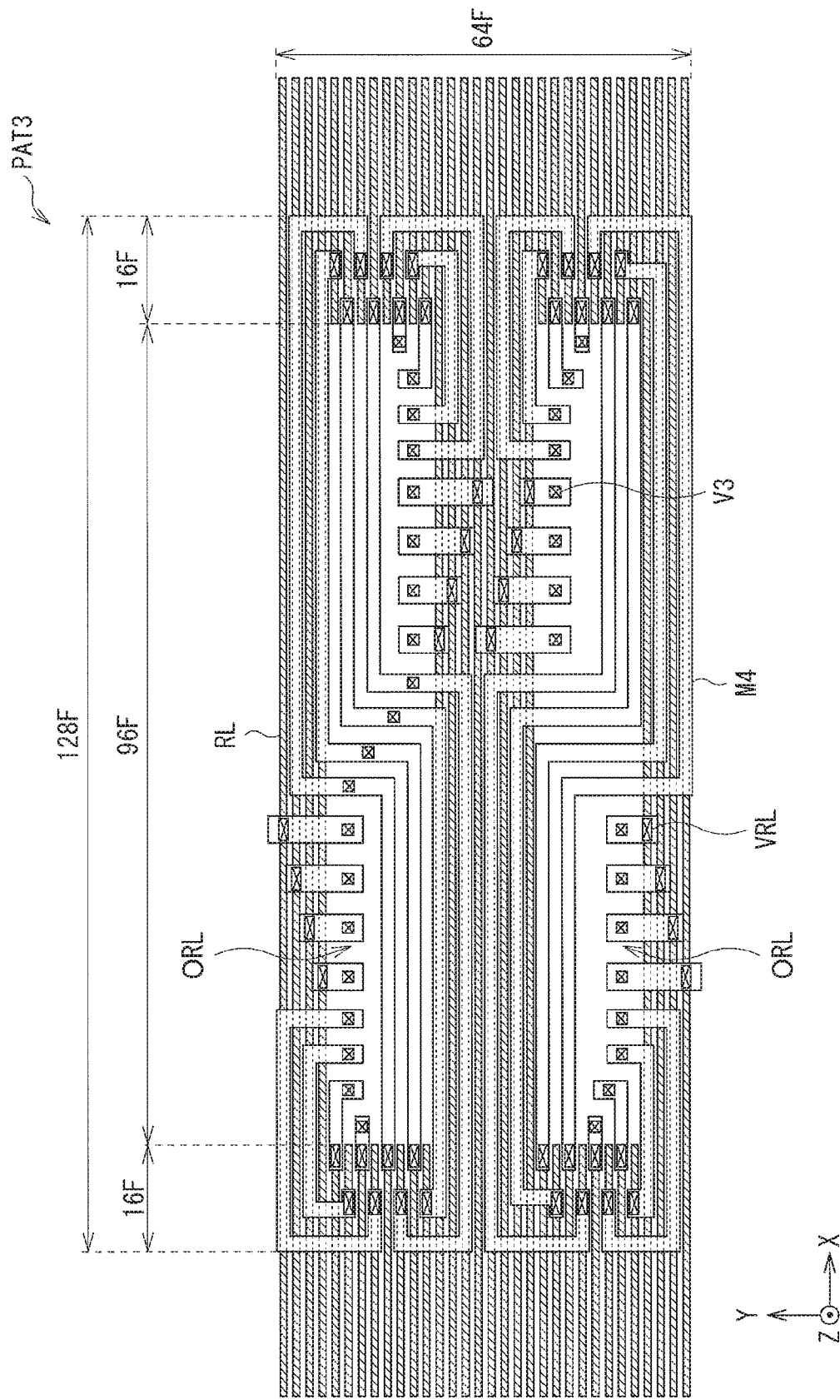
[FIG. 30]

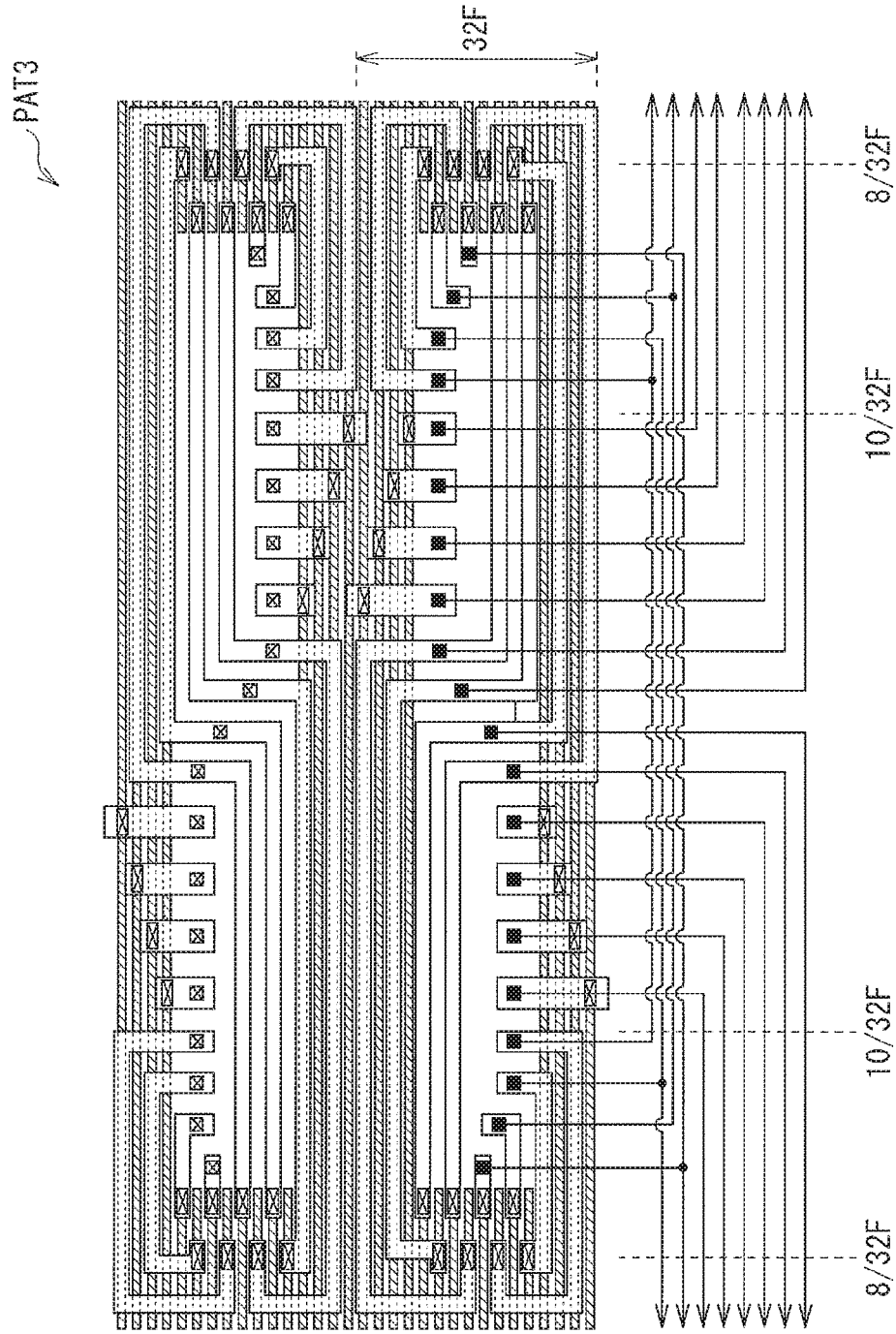
[FIG. 31]

WIRING LINE LAYOUT IN A SEMICONDUCTOR MEMORY DEVICE

CROSS REFERENCE TO RELATED APPLICATIONS

This application is a U.S. National Phase of International Patent Application No. PCT/JP2018/015799 filed on Apr. 17, 2018, which claims priority benefit of Japanese Patent Application No. JP2017-105367 filed in the Japan Patent Office on May 29, 2017. Each of the above-referenced applications is hereby incorporated herein by reference in its entirety.

TECHNICAL FIELD

The present disclosure relates to a semiconductor device that is able to store information.

BACKGROUND ART

In recent years, for example, much focus has been placed on nonvolatile memory devices using a resistive random access memory that allows for performance of faster data access than flash memories. For example, PTL 1 discloses a memory device including a selection line bent in a socket region.

CITATION LIST

Patent Literature

PTL 1: U.S. Unexamined Patent Application Publication No. 2014/0239512

SUMMARY OF THE INVENTION

Incidentally, in semiconductor devices, higher yield is generally desired, and further improvement in yield is expected.

It is desirable to provide a semiconductor device that makes it possible to enhance yield.

A semiconductor device according to an embodiment of the present disclosure includes a plurality of first selection lines, a first metal wiring line, a first through wiring line, a second through wiring line, a first storage element, and a first drive circuit. The plurality of first selection lines is provided in a region other than a plurality of opening regions in a first region in a first selection line layer, has a predetermined width, and extends in a first direction and is disposed side by side in a second direction intersecting with the first direction. The first metal wiring line is formed in a layer above the first selection line layer. The first through wiring line penetrates an insulating layer formed on the first selection line layer, and couples a first line of the plurality of first selection lines and the first metal wiring line to each other. The second through wiring line is provided in a first opening region of the plurality of opening regions, penetrates the first selection line layer, and has one end coupled to the first metal wiring line. The first storage element has a first terminal, and a second terminal coupled to the first line. The first drive circuit is coupled to another end of the second through wiring line, and drives the plurality of first selection lines.

In the semiconductor device according to the embodiment of the present disclosure, the plurality of first selection lines that has the predetermined width, and extends in the first direction and is disposed side by side in the second direction is formed in a region other than the plurality of opening regions in the first region. The first metal wiring line is formed in a layer above the first selection line layer in which the plurality of first selection lines is formed. The first metal wiring line is coupled to the first line of the plurality of first selection lines with use of the first through wiring line. The first line is coupled to the first storage element. In addition, the first metal wiring line is coupled to the first drive circuit with use of the second through wiring line provided in the first opening region.

According to the semiconductor device in the embodiment of the present disclosure, the plurality of first selection lines that has the predetermined width, and extends in the first direction and is disposed side by side in the second direction is provided in a region other than the plurality of opening regions in the first region, and the first metal wiring line that is formed in a layer above the first selection line layer and is coupled to the first drive circuit with use of the second through wiring line provided in the first opening region is coupled to the first line of the plurality of first selection lines with use of the first through wiring line, which makes it possible to enhance yield. It is to be noted that the effects described herein are not necessarily limited, and any of effects described in the present disclosure may be included.

BRIEF DESCRIPTION OF THE DRAWINGS

FIG. 1 is a block diagram illustrating a configuration example of a semiconductor device according to an embodiment of the present disclosure.

FIG. 2 is a block diagram illustrating a configuration example of a memory section illustrated in FIG. 1.

FIG. 3 is a perspective view of a configuration example of row selection lines and column selection lines according to the embodiment.

FIG. 4 is a circuit diagram illustrating a configuration example of a memory cell illustrated in FIG. 3.

FIG. 5 is a characteristic diagram illustrating a characteristic example of a storage element illustrated in FIG. 3.

FIG. 6 is an explanatory diagram illustrating an example of coupling between the row selection line illustrated in FIG. 5 and a row selection line coupling section.

FIG. 7 is an explanatory diagram illustrating an example of coupling between the column selection line illustrated in FIG. 5 and a column selection line coupling section.

FIG. 8 is an explanatory diagram illustrating a configuration example of the row selection lines according to the embodiment.

FIG. 9 is an explanatory diagram illustrating an example of a row selection line region and a coupling region according to the embodiment.

FIG. 10 is an explanatory diagram illustrating an example of a layout of a coupling region according to a first embodiment.

FIG. 11 is a cross-sectional view of an example of the layout of the coupling region according to the first embodiment.

FIG. 12 is another explanatory diagram illustrating an example of a layout of a coupling region according to the first embodiment.

FIG. 13 is an explanatory diagram illustrating a configuration example of the column selection lines according to the embodiment.

FIG. 14 is an explanatory diagram illustrating an example of a column selection line region and a coupling region according to the embodiment.

FIG. 15 is a cross-sectional view of an example of a layout of a coupling region according to the first embodiment.

FIG. 16 is an explanatory diagram illustrating a configuration example of row control lines and column control lines in the memory section according to the embodiment.

FIG. 17 is an explanatory diagram illustrating a configuration example of row selection lines according to a comparative example.

FIG. 18 is an explanatory diagram illustrating a configuration example of column selection lines according to the comparative example.

FIG. 19 is a perspective view of a configuration example of row selection lines and column selection lines according to a modification example.

FIG. 20 is an explanatory diagram illustrating an example of coupling between the row selection line illustrated in FIG. 19 and a row selection line coupling section.

FIG. 21 is an explanatory diagram illustrating an example of coupling between another row selection line illustrated in FIG. 19 and the row selection line coupling section.

FIG. 22 is an explanatory diagram illustrating an example of coupling between the column selection line illustrated in FIG. 19 and a column selection line coupling section.

FIG. 23 is an explanatory diagram illustrating a configuration example of the row selection lines according to the modification example.

FIG. 24 is an explanatory diagram illustrating a configuration example of other row selection lines according to the modification example.

FIG. 25 is an explanatory diagram illustrating a configuration example of the column selection lines according to the modification example.

FIG. 26 is an explanatory diagram illustrating a configuration example of row control lines and column control lines in a memory section according to the modification example.

FIG. 27 is an explanatory diagram illustrating an example of a layout of a coupling region according to a second embodiment.

FIG. 28 is another explanatory diagram illustrating an example of the layout of the coupling region according to the second embodiment.

FIG. 29 is another diagram illustrating an example of the layout of the coupling region according to the second embodiment.

FIG. 30 is an explanatory diagram illustrating an example of a layout of a coupling region according to a third embodiment.

FIG. 31 is another explanatory diagram illustrating an example of a layout of the coupling region according to the third embodiment.

MODES FOR CARRYING OUT THE INVENTION

In the following, some embodiments of the present disclosure are described in detail with reference to the drawings. It is to be noted that description is given in the following order.
1. First Embodiment
2. Second Embodiment
3. Third Embodiment

1. First Embodiment

Configuration Example

FIG. 1 illustrates a configuration example of a semiconductor device (semiconductor device 1) according to a first embodiment. The semiconductor device 1 includes a memory section 20 and a peripheral circuit section 90. The memory section 20 is a so-called cross-point memory and is a nonvolatile memory. The peripheral circuit section 90 includes various circuits associated with an operation of the memory section 20. Specifically, the peripheral circuit section 90 includes, for example, a power source circuit, a reference voltage generating circuit, and the like. The power source circuit generates a select voltage Vsel and a non-select voltage Vinh that are to be described later, and the reference voltage circuit generates a reference voltage Vref used in a case where a reading operation is performed. It is to be noted that the circuits are not limited to the circuits described above, and the peripheral circuit section 90 may further include, for example, an oscillator circuit and a delay circuit, and a temperature sensor. The oscillator circuit and the delay circuit define operation speed and operation timing of the memory section 20, and the temperature sensor measures a temperature in the memory section 20.

(Memory Section 20)

FIG. 2 illustrates a configuration example of the memory section 20. The memory section 20 includes a plurality of row controllers 21, a plurality of column controllers 22, a plurality of row selection line drivers (RLD) 23 (row selection line drivers (RLD) 231 and 232), and a plurality of column selection line drivers (CLD) 24 (column selection line drivers (CLD) 241 and 242). In FIG. 2, out of the plurality of row selection line drivers (RLD) 23 and the plurality of column selection line drivers (CLD) 24, the plurality of column selection line drivers (CLD) 24 is drawn by thick lines.

In the memory section 20, the plurality of row selection line drivers (RLD) 23 and the plurality of column selection line drivers (CLD) 24 are arranged in a checkerboard fashion. Specifically, in this example, the row selection line drivers (RLD) 231 and the column selection line drivers (CLD) 241 are arranged adjacent to each other in an X direction, and the column selection line drivers (CLD) 242 and the row selection line drivers (RLD) 232 are arranged adjacent to each other in the X direction. In addition, the row selection line drivers (RLD) 231 and the column selection line drivers (CLD) 242 are arranged adjacent to each other in a Y direction, and the column selection line drivers (CLD) 241 and the row selection line drivers (RLD) 232 are arranged adjacent to each other in the Y direction.

Each of the row controllers 21 generates a selection control signal SELRL on the basis of a row address signal ADRRL and a mode signal MD. The row address signal ADRRL indicates a row address of a memory cell MC (to be described later) as a target for a writing operation or a reading operation. The mode signal MD instructs an operation such as the writing operation and the reading operation. The same row address signal ADRRL and the same mode signal MD are supplied to the plurality of row controllers 21. Thereafter, the respective row controllers 21 supply the generated selection control signal SELRL to the plurality of row selection line drivers (RLD) 23 through row control lines CRL (row control lines CRL1 and CRL2) extending in the Y direction. Specifically, each of the row controllers 21 supplies a selection control signal SELRL1 included in the selection control signal SELRL to a plurality of row selection line drivers (RLD) 231 coupled to the row control line CRL1 through the row control line CRL1, and supplies a selection control signal SELRL2 included in the selection control signal SELRL to a plurality of row selection line drivers (RLD) 232 coupled to the row control line CRL2 through the row control line CRL2.

Each of the column controllers 22 generates a selection control signal SELCL on the basis of a column address signal ADRCL and the mode signal MD. The column address signal ADRCL indicates a column address of the memory cell MC (to be described later) to be subjected to the writing operation or the reading operation. The same column address signal ADRCL and the same mode signal MD are supplied to the plurality of column controllers 22. The respective column controllers 22 supply the generated selection control signal SELCL to the plurality of column selection line drivers (CLD) 24 through column control lines CCL (column control lines CCL1 and CCL2) extending in the X direction. Specifically, each of the column controllers 22 supplies a selection control signal SELCL1 included in the selection control signal SELCL to a plurality of column selection line drivers (CLD) 241 coupled to the column control line CCL1 through the column control line CCL1, and supplies a selection control signal SELCL2 included in the selection control signal SELCL to a plurality of column selection line drivers (CLD) 242 coupled to the column control line CCL2 through the column control line CCL2.

Each of the row selection line drivers (RLD) 23 drives a row selection line RL (to be described later) on the basis of the selection control signal SELRL. Specifically, the row selection line driver (RLD) 231 drives the row selection line RL (to be described later) on the basis of the selection control signal SELRL1 supplied through the row control line CRL1. In addition, the row selection line driver (RLD) 232 drives the row selection line RL (to be described later) on the basis of the selection control signal SELRL2 supplied through the row control line CRL2. In addition, the row selection line drivers (RLD) 231 and 232 are coupled to an unillustrated sense amplifier. As will be described later, the sense amplifier performs the reading operation by comparing a voltage generated in the memory cell MC (to be described later) with the reference voltage Vref.

Each of the column selection line drivers (CLD) 24 drives a column selection line CL (to be described later) on the basis of the selection control signal SELCL. Specifically, the column selection line driver (CLD) 241 drives the column selection line CL (to be described later) on the basis of the selection control signal SELCL1 supplied through the column control line CCL1. The column selection line driver (CLD) 242 drives the column selection line CL (to described later) on the basis of the selection control signal SELCL2 supplied through the column control line CCL2.

FIG. 3 illustrates a configuration example of the memory section 20. The memory section 20 includes a plurality of row selection lines RL, a plurality of column selection lines CL, and a plurality of memory cells MC.

The plurality of row selection lines RL is formed to extend in the X direction and be disposed side by side in the Y direction in an X-Y plane parallel to a substrate surface S of a semiconductor substrate. The plurality of column selection lines CL is formed to extend in the Y direction and be disposed side by side in the X direction in the X-Y plane. The plurality of column selection lines CL is formed in a layer above a layer in which the plurality of row selection lines RL is formed. In this configuration, the plurality of row selection lines RL and the plurality of column selection lines CL intersect with each other. The plurality of memory cells MC is formed in a storage layer between the layer in which the plurality of row selection lines RL is formed and the layer in which the plurality of column selection lines CL is formed.

FIG. 4 illustrates a configuration example of the memory cell MC. The memory cell MC includes a storage element VR, a selection element SE, and terminals TU and TL.

The storage element VR is a resistive random access storage element, and having a resistance state RS that changes reversibly in accordance with a polarity of a voltage difference between voltages applied to both ends. In other words, the resistance state RS of the storage element VR changes reversibly in accordance with a direction of a current flowing between both ends. For the storage element VR, for example, it is possible to use a stack of an ion source layer and a resistance change layer. The storage element VR has one end coupled to the terminal TU of the memory cell MC, and another end coupled to one end of the selection element SE.

FIG. 5 schematically illustrates a distribution of a resistance value of the storage element VR. The storage element VR possibly takes two identifiable resistance states RS (a high-resistance state HRS and a low-resistance state LRS). In this example, the high-resistance state HRS corresponds to data "0" and the low-resistance state LRS corresponds to data "1", for example. That is, the storage element VR functions as a storage element that stores one-bit data. For example, changing from the high-resistance state HRS to the low-resistance state LRS is referred to as "set", and changing from the low-resistance state LRS to the high-resistance state HRS is referred to as "reset".

The selection element SEs (FIG. 4) have bidirectional diode characteristics. Specifically, the selection element SE becomes a conductive state (on-state) in a case where an absolute value of the voltage difference between the voltages applied to both ends is larger than a predetermined voltage difference, and becomes a nonconductive state (off-state) in a case where the absolute value of the voltage difference is smaller than the predetermined voltage difference. The one end of the selection element SE is coupled to another end of the storage element VR, and another end is coupled to the TL terminal of the memory cell MC.

The terminal TU is a terminal coupled to a selection line above the storage layer in which the memory cell MC is formed, and the terminal TL is a terminal coupled to a selection line below the storage layer in which the memory cell MC is formed. In this example, as illustrated in FIG. 3, in the memory cell MC, the terminal TU is coupled to one of the plurality of column selection lines CL, and the terminal TL is coupled to one of the plurality of row selection lines RL.

In a case where the memory cell MC is set, the select voltage Vsel of, for example, 6 V is applied to the terminal TU, and the select voltage Vsel of, for example, 0 V is applied to the terminal TL. As a result, the selection element SE is turned on, and, as illustrated in FIG. 4, a set current Iset flows from the terminal TU toward the terminal TL, and the storage element VR is set. In a case where the memory cell MC is reset, the select voltage Vsel of, for example, 6 V is applied to the terminal TL, and the select voltage Vsel of, for example, 0 V is applied to the terminal TU. As a result, the selection element SE is turned on, and a reset current Irst flows from the terminal TL toward the terminal TU, and the storage element VR is reset. In a case where the reading operation is performed on the memory cell MC, the select voltage Vsel of, for example, 5 V is applied to the terminal TU, and the select voltage Vsel of, for example, 1 V is applied to the terminal TL. As a result, a sense current Isns flows from the terminal TU toward the terminal TL. Thereafter, an unillustrated sense amplifier coupled to the row select driver (RLD) 23 compares a voltage generated in the memory cell MC with the reference voltage Vref to determine the resistance state RS of the storage element VR.

In the memory section 20, the memory cell MC is selected by applying the select voltage Vsel is applied to each of the row selection line RL and the column selection line CL, and the writing operation (set or reset) or the reading operation is performed. In the memory section 20, as illustrated in FIG. 2, the same row address signal ADRRL and the same mode signal MD are supplied to a plurality of row controllers 21 and the same column address signal ADRCL and the same mode signal MD are supplied to a plurality of column controllers 22; therefore, the select voltage Vsel is applied to a plurality of row selection lines RL corresponding to each other, and the select voltage Vsel is applied to a plurality of column selection lines CL corresponding to each other, for example. It is to be noted that the non-select voltage Vinh is applied to other row selection lines RL and other column selection lines CL. Thus, in the memory section 20, a plurality of memory cells MC is selected, and the writing operation or the reading operation is performed simultaneously on the respective selected memory cells MC.

FIG. 6 illustrates an example of coupling between the row selection line RL and the row selection line driver (RLD) 23. FIG. 7 illustrates an example of coupling between the column selection line CL and the column selection line driver (CLD) 24.

The memory section 20 includes two selection line layers LRL and LCL and four wiring layers LM1 to LM4. The selection line layer LRL is a wiring layer in which the row selection line RL is formed, and the selection line layer LCL is a wiring layer in which the column selection line CL is formed. The four wiring layers LM1 to LM4 are wiring layers in which metal wiring lines M1 to M4 are formed, respectively. The metal wiring line M1 is mainly used for local wiring in a circuit, and the metal wiring lines M2 and M3 are mainly used for wiring between circuits. The metal wiring line M4 is used, for example, in a case where the row selection line RL is coupled to the row selection line driver (RLD) 23 or in a case where the column selection line CL is coupled to the column selection line driver (CLD) 24. The wiring layer LM1, the wiring layer LM2, the wiring layer LM3, the selection line layer LRL, the selection line layer LCL, and the wiring layer LM4 are formed in this order on the semiconductor substrate. Insulating layers are interposed between respective adjacent ones of these layers.

As illustrated in FIG. 6, the row selection line RL and the row selection line driver (RLD) 23 are coupled to each other through a coupling section 13. The coupling section 13 includes a contact CT that couples a transistor TR of the row selection line driver (RLD) 23 and the metal wiring line M1 to each other, the metal wiring line M1, a via V1 between the wiring layers LM1 and LM2, the metal wiring line M2, a via V2 between the wiring layers LM2 and LM3, the metal wiring line M3, a via V3 between the wiring layers LM3 and the LM4, the metal wiring line M4, and a via VRL between the metal wiring line M4 and the row selection line RL. The via VRL has a so-called tapered shape. Specifically, the via VRL is formed to have a width that is wide near the metal wiring line M4 and narrow near the row selection line RL.

As illustrated in FIG. 7, the column selection line CL and the column selection line driver (CLD) 24 are coupled to each other through a coupling section 14. The coupling section 14 includes the contact CT that couples the transistor TR of the column selection line driver (CLD) 24 and the metal wiring line M1 to each other, the metal wiring line M1, the via V1 between the wiring layers LM1 and LM2, the metal wiring line M2, the via V2 between the wiring layers LM2 and LM3, the metal wiring line M3, the via V3 between the wiring layers LM3 and LM4, the metal wiring line M4, and the via VCL between the metal wiring line M4 and the column selection line CL. The via VCL has a so-called tapered shape. Specifically, the via VCL is formed to have a width that is wide near the metal wiring line M4 and narrow near the column selection line CL.

(Row Selection Lines RL)

FIG. 8 illustrates an example of the row selection lines RL. Each of the plurality of row selection lines RL is coupled to the coupling section 13 (a coupling section 131 or 132) in the vicinity of the middle in an extending direction (X direction) of the row selection line RL. In addition, each of the row selection line drivers (RLD) 231 is coupled to the coupling section 131 in the vicinity of the middle in the X direction of the row selection line driver (RLD) 231, and each of the row selection line drivers (RLD) 232 is coupled to the coupling section 132 in the vicinity of the middle in the X direction of the row selection line driver (RLD) 232. Thus, the row selection line driver (RLD) 231 is coupled to a plurality of row selection lines RL through the coupling section 131, and the row selection line driver (RLD) 232 is coupled to a plurality of row selection lines RL through the coupling section 132. It is to be noted that in this example, each of the coupling sections 131 and 132 includes two coupling sections adjacent to each other in the Y direction.

One row selection line driver (RLD) 231 is coupled to a plurality of (512 in this example) row selection lines RL, for example. In FIG. 8, right-side ends of these row selection lines RL coupled to the row selection line driver (RLD) 231 are located in the vicinity of the middle in the X direction of the column selection line driver (CLD) 241 located on the right of the row selection line driver (RLD) 231. In addition, left-side ends of these row selection lines RL coupled to the row selection line driver (RLD) 231 are located in the vicinity of the middle in the X direction of the column selection line driver (CLD) 241 located on the left of the row selection line driver (RLD) 231.

Similarly, one row selection line driver (RLD) 232 is coupled to a plurality of (512 in this example) row selection lines RL. In FIG. 8, right-side ends of these row selection lines RL coupled to the row selection line driver (RLD) 232 are located in the vicinity of the middle in the X direction of the column selection line driver (CLD) 242 located on the right of the row selection line driver (RLD) 232. In addition, left-side ends of these row selection line RL coupled to row selection line driver (RLD) 232 are located in the vicinity of the middle in the X direction of the column selection line driver (CLD) 242 located on the left of the row selection line driver (RLD) 232.

The plurality of row selection line drivers (RLD) 23 and the plurality of column selection line drivers (CLD) 24 are arranged in a checkerboard fashion, which causes the plurality of row selection lines RL coupled to the row selection line driver (RLD) 231 and the plurality of row selection lines RL coupled to the row selection line driver (RLD) 232 to be shifted from each other in the X direction.

(Coupling Sections 131 and 132)

FIG. 9 illustrates an example of the configuration of coupling section 131 or 132. The row selection lines RL coupled to coupling section 131 are formed in a row selection line region 151. The coupling section 131 is formed in a coupling region 171. The coupling region 171 is provided in the vicinity of the middle in the X direction of the row selection line region 151. Similarly, the row selection lines RL coupled to the coupling section 132 are formed in a row selection line region 152. The coupling section 132 is formed in a coupling region 172. The coupling region 172 is provided in the vicinity of the middle in the X direction of the row selection line region 152. Hereinafter, the coupling section 131 will be described as an example, but the same applies to the coupling section 132.

FIG. 10 illustrates an example of a layout pattern of the coupling region 171. As illustrated in FIG. 9, in the layout pattern of the coupling region 171, patterns PAT1 illustrated in FIG. 10 are provided side by side in the Y direction. FIG. 10 illustrates a plurality of row selection lines RL in selection line layer LRL, the metal wiring line M4 in the wiring layer LM4, and the vias V3 and VRL. FIG. 11 illustrates a cross-sectional configuration taken in a direction of an arrow I-I in FIG. 10. In this pattern PAT1, 32 row selection lines RL are coupled to the row selection line driver 231 (RLD).

As illustrated in FIGS. 9 to 11, the coupling region 171 is provided with a plurality of openings ORL. The row selection lines RL are formed to extend in the X direction and be disposed side by side in the Y direction in a region other than the plurality of openings ORL in the row selection line region 151. In this example, a pitch of the row selection lines RL is 2F. Herein, "F" indicates a minimum processing dimension, and is 20 nm in this example. That is, the pitch of the row selection lines RL is 40 nm. The pitch corresponds to a case where a width of the row selection line RL is F (20 nm in this example) and an interval between adjacent ones of the row selection lines RL is F (20 nm in this example).

In each of the openings ORL, a plurality of vias V3 is formed to penetrate the selection line layer LRL. Each of the vias V3 is coupled to the metal wiring line M4 of the wiring layer LM4. Thus, the metal wiring line M4 is coupled to a top surface of the row selection line RL through the via VRL. In addition, the via V3 is coupled to the row selection line driver (RLD) 231 formed on the semiconductor substrate. It is to be noted that in FIG. 11, the via V3 and the semiconductor substrate below the via V3 are coupled to each other at the shortest distance, but this is not limitative.

The metal wiring line M4 is routed in the wiring layer LM4 to couple the row selection line RL and the via V3 to each other, as illustrated in FIG. 10. A minimum pitch of the metal wiring lines M4 is 4F (80 nm in this example). The minimum pitch corresponds to a case where a width of the metal wiring line M4 is 2F (40 nm in this example) and an interval between adjacent ones of the metal wiring lines M4 is 2F (40 nm in this example).

In the example illustrated in FIG. 10, the pattern PAT1 is a pattern having a length of 176F (3520 nm in this example) in the X direction and a length of 64F (1280 nm in this example) in the Y direction. A minimum pitch of the vias V3 is 4F (80 nm in this example). A minimum pitch in the X direction of the vias VRL is 6F (120 nm in this example) and a minimum pitch in the Y direction of the vias VRL is 4F (80 nm in this example).

As illustrated in FIG. 8, each of the row selection line drivers (RLD) 231 is coupled to the coupling section 131 in the vicinity of the middle in the X direction of the row selection line driver (RLD) 231. Accordingly, in the row selection line driver (RLD) 231, it is possible to couple 256 wiring lines to the coupling section 131 from the left of the coupling section 131 and couple 256 wiring lines to the coupling section 131 from the right of the coupling section 131 in the wiring layers LM1 to LM3 below the selection line layer LRL in which the row selection lines RL are formed.

FIG. 12 schematically illustrates coupling to the coupling section 131 in the row selection line driver (RLD) 231. In this example, wiring lines related to sixteen row selection lines RL on lower side of thirty two row selection lines RL included in the pattern PAT1 are schematically illustrated. In the wiring layers LM1 to LM3, eight row selection lines RL of the sixteen row selection lines RL are coupled from the left of the coupling section 131, and the remaining eight row selection lines RL are coupled from the right of the coupling section 131. That is, up to eight wiring lines are disposed in the wiring layer LM1 to LM3 below the sixteen row selection lines RL. In this case, a maximum value of line density of the wiring lines is 8 lines/32F.

(Column Selection Lines CL)

FIG. 13 illustrates an example of the column selection lines CL. Each of the plurality of column selection lines CL is coupled to the coupling section 14 (a coupling section 141 or 142) in the vicinity of the middle in an extending direction (Y direction) of the column selection line CL. In addition, each of the column selection line drivers (CLD) 241 is coupled to the coupling section 141 in the vicinity of the middle in the Y direction of the column selection line driver (CLD) 241, and each of the column selection line drivers (CLD) 242 is coupled to the coupling section 142 in the vicinity of the middle in the Y direction of the column selection line driver (CLD) 242. Thus, the column selection line driver (CLD) 241 is coupled to a plurality of column selection lines CL through the coupling section 141, and the column selection line driver (CLD) 242 is coupled to a plurality of column selection lines CL through the coupling section 142. It is to be noted that in this example, each of the coupling sections 141 and 142 includes two coupling sections adjacent to each other in the X direction.

One column selection line driver (CLD) 241 is coupled to a plurality of (512 in this example) column selection lines CL. In FIG. 13, upper ends of these column selection lines CL coupled to the column selection line driver (CLD) 241 are located in the vicinity of the middle in the Y direction of the row selection line driver (RLD) 232 located above the column selection line driver (CLD) 241. In addition, lower ends of these column selection lines CL coupled to the column selection line driver (CLD) 241 are located in the vicinity of the middle in the Y direction of the row selection line driver (RLD) 232 located below the column selection line driver (CLD) 241.

Similarly, one column selection line driver (CLD) 242 is coupled to a plurality of (512 in this example) column selection lines CL. In FIG. 13, upper ends of these column selection lines CL coupled to column selection line driver (CLD) 242 are located in the vicinity of the middle in the Y direction of the row selection line driver (RLD) 231 located above the column selection line driver (CLD) 242. In addition, lower ends of these column selection lines CL coupled to the column selection line driver (CLD) 242 are located in the vicinity of the middle in the Y direction of the row selection line driver (RLD) 231 located below the column selection line driver (CLD) 242.

The plurality of row selection line drivers (RLD) 23 and the plurality of column selection line drivers (CLD) 24 are arranged in a checkerboard shape, which causes the plurality of column selection lines CL coupled to the column selection line driver (CLD) 241 and the plurality of column selection lines CL coupled to the column selection line driver (CLD) 242 to be shifted from each other in the Y direction.

(Coupling Sections 141 and 142)

FIG. 14 illustrates a configuration example of the coupling section 141 or 142. The column selection lines CL coupled to the coupling section 141 are formed in a column selection line region 161. The coupling section 141 is formed in a coupling region 181. The coupling region 181 is provided in the vicinity of the middle in the Y direction of the column selection line region 161. Similarly, the column selection lines CL coupled to the coupling section 142 are formed in a column selection line region 162. The coupling section 142 is formed in a coupling region 182. The coupling region 182 is provided in the vicinity of the middle in the Y direction of the column selection line region 162. Hereinafter, the coupling section 141 will be described as an example, but the same applies to the coupling section 142.

As a layout pattern of the coupling region 181, for example, it is possible to use a layout pattern similar to the layout pattern of the coupling region 171 (FIG. 10), except that the row selection lines RL are replaced with the column selection lines CL. The coupling region 181 is provided with a plurality of openings OCL similarly to the coupling region 171 (FIG. 10). The column selection lines CL are formed to extend in the Y direction and be disposed side by side in the X direction in a region other than the plurality of openings OCL in the column selection line region 161.

FIG. 15 illustrates a cross-sectional configuration of the coupling section 141. FIG. 15 corresponds to FIG. 11 that illustrates the cross-sectional configuration of the coupling section 131. In each of the openings OCL, a plurality of vias V3 is formed to penetrate the selection line layer LCL. Each of the vias V3 is coupled to the metal wiring line M4 of the wiring layer LM4. Thus, the metal wiring line M4 is coupled to a top surface of the column selection line CL through the via VCL. In addition, the via V3 is coupled to the column selection line driver (CLD) 241 formed on the semiconductor substrate.

FIG. 16 illustrates examples of a plurality of row selection lines RL and a plurality of column selection lines CL. FIG. 16 illustrates superposition of the plurality of row selection lines RLs illustrated in FIG. 8 and the plurality of column selection lines CL illustrated in FIG. 13.

The row selection lines RL extend in the X direction in the selection line layer LRL and the column selection lines CL extend in the Y direction in the selection line layer LCL, which causes the row selection lines RL and the column selection lines CL to intersect with each other. Each of the plurality of row selection lines RL intersects with 1024 (=512×2) column selection lines CL in this example, and each of the plurality of column selection lines CL intersects with 1024 (=512×2) row selection lines RL in this example. The memory cells MC are formed at the intersections in a layer between the selection line layer LRL and the selection line layer LCL. In the memory section 20, as illustrated in FIG. 16, a memory array AR including 1M (=1024×1024) memory cells MC is defined. As illustrated in FIG. 8, the memory array AR includes 512 row selection lines RL coupled to the row selection line driver (RLD) 231, and 512 row selection lines RL coupled to the row selection line driver (RLD) 232. That is, in this example, considering that the row selection line drivers (RLD) 231 and 232 are coupled to an unillustrated sense amplifier, the row selection line drivers (RLD) 231 and 232 define the memory array AR in terms of the reading operation. The column selection lines CL are formed to extend across adjacent memory arrays AR, as illustrated in FIG. 13.

Herein, for example, the selection line layer LRL corresponds to a specific example of a "first selection line layer" in the present disclosure. The plurality selection lines RL coupled to row selection line drivers (RLD) 231 and 232 corresponds to a specific example of a "plurality of first selection lines" in the present disclosure. The row selection line regions 151 and 152 correspond to specific examples of a "first region" in the present disclosure. The opening ORL corresponds to a specific example of an "opening region" in the present disclosure. The metal wiring lines M4 in the coupling regions 171 and 172 correspond to specific examples of a "first metal wiring line" and a "second metal wiring line" in the present disclosure. The vias VRL in the coupling regions 171 and 172 correspond to specific examples of a "first through wiring line" and a "third through wiring line" in the present disclosure. The vias V3 in the coupling regions 171 and 172 correspond to specific examples of a "second through wiring line" and a "fourth through wiring line" in the present disclosure. The memory cells MC correspond to specific examples of a "first storage element" and a "second storage element" in the present disclosure.

For example, the selection line layer LCL corresponds to a specific example of a "second selection line layer" in the present disclosure. The plurality of column selection lines CL coupled to the column selection line drivers (CLD) 241 and 242 corresponds to a specific example of a "plurality of second selection lines" in the present disclosure. The column selection line regions 161 and 162 correspond to specific examples of a "second region" in the present disclosure. The opening OCL corresponds to a specific example of an "opening region" in the present disclosure. The metal wiring lines M4 in the coupling regions 181 and 182 correspond to specific examples of a "third metal wiring line" in the present disclosure. The vias VRL in the coupling regions 181 and 182 correspond to specific examples of a "fifth through wiring line" in the present disclosure. The vias V3 in the coupling regions 181 and 182 correspond to specific examples of a "sixth through wiring line" in the present disclosure.

[Operation and Workings]

Next, operation and workings of the semiconductor device 1 according to the present embodiment will be described.

(Overview of Overall Operation)

First, an overview of an entire operation of the memory section 20 will be described with reference to FIG. 2. Each of the row controllers 21 of the memory section 20 generates the selection control signal SELRL (the selection control signals SELRL1 and SELRL2) on the basis of the row address signal ADRRL and the mode signal MD. Each of the column controllers 22 generates the selection control signal SELCL (the selection control signals SELCL1 and SELCL2) on the basis of the column address signal ADRCL and the mode signal MD.

Each of the row selection line drivers (RLD) 231 drives a plurality of (512 in this example) row selection lines RL coupled to that row selection line driver (RLD) 231 on the basis of the selection control signal SELRL1. Each of the row selection line drivers (RLD) 232 drives a plurality of (512 in this example) row selection lines RL coupled to that row selection line driver (RLD) 232 on the basis of the selection control signal SELRL2.

Each of the column selection line drivers (CLD) 241 drives a plurality of (512 in this example) column selection lines CL coupled to that column selection line driver (CLD) 241 on the basis of the selection control signal SELCL1. Each of the column selection line drivers (CLD) 242 drives a plurality of (512 in this example) column selection lines CL coupled to that column selection line driver (CLD) 242 on the basis of the selection control signal SELCL2.

(Workings)

In the semiconductor device 1, the row selection lines RL having the predetermined width (F) are formed to extend in the X direction and be disposed side by side in the Y direction in a region other than the plurality of openings ORL in the row selection line regions 151 and 152. The row selection lines CL having the predetermined width (F) are formed to extend in the Y direction and be disposed side by side in the X direction in a region other than the plurality of openings OCL in the column selection line regions 161 and 162. That is, in the semiconductor device 1, the linear row selection lines RL and the linear column selection lines CL are formed. This makes it possible to enhance yield in the semiconductor device 1.

That is, in the semiconductor device 1, it is desirable to form the row selection lines RL and the column selection lines CL with the minimum processing dimension in order to increase storage capacity. In recent years, for example, using a patterning technique such as SAMP (Self-Aligned Multiple Patterning) makes it possible to form a fine pattern. In this case, it is desirable that the row selection lines RL and the column selection lines CL be linear without being bent in the X-Y plane or changing a line width. If the row selection lines RL and the column selection lines CL are not linear, for example, adjacent wiring lines may be short-circuited to each other, resulting in a decrease in yield. In contrast, in the semiconductor device 1, the linear row selection lines RL and the linear column selection lines CL are formed, which makes it possible to enhance yield.

In addition, in the semiconductor device 1, the row selection line RL is coupled to the row selection line driver (RLD) 23 through the metal wiring line M4 formed above the upper layer of the row selection line RL, and the column selection line CL is coupled to the column selection line driver (CLD) 24 through the metal wiring line M4 formed above the column selection line CL. Specifically, in the semiconductor device 1, the via VRL having a tapered shape is used to couple the metal wiring line M4 and the row selection line RL to each other, and the via VCL having a tapered shape is used to couple the metal wiring line M4 and the column selection line CL to each other. This reduces a possibility that the via VRL is coupled to the row selection line RL next to the row selection line RL to which the via VRL is supposed to be coupled, and reduces a possibility that the via VCL is coupled to the column selection line CL next to the column selection line CL to which the via VCL is supposed to be coupled. As a result, in the semiconductor device 1, it is possible to reduce a possibility that yield is decreased.

Further, in the semiconductor device 1, the plurality of openings ORL is provided in the coupling regions 171 and 172, and the via V3 is provided in each of the openings ORL, which makes it possible to couple the metal wiring line M4 disposed above the row selection line RL to the row selection line driver (RLD) 23 disposed below the row selection line RL. Similarly, the plurality of openings OCL is provided in the coupling regions 181 and 182, and the via V3 is provided in each of the openings OCL, which makes it possible to couple the metal wiring line M4 disposed above the column selection line CL to the column selection line driver (CLD) 24 disposed below the column selection line CL.

In addition, in the semiconductor device 1, as illustrated in FIG. 8, a plurality of (512 in this example) row selection lines RL coupled to the row selection line driver (RLD) 231 is provided side by side in one region, and a plurality of (512 in this example) row selection lines RL coupled to the row selection line driver (RLD) 232 is provided side by side in one region. Similarly, in the semiconductor device 1, as illustrated in FIG. 13, a plurality of (512 in this example) column selection lines CL coupled to the column selection line driver (CLD) 241 is provided side by side in one region, and a plurality of (512 in this example) column selection lines CL coupled to the column selection line driver (CLD) 242 is provided side by side in one region. This makes it possible to simplify the operation of the memory section 20 in the semiconductor device 1.

That is, for example, in a case where, as in a memory section 20S illustrated in FIGS. 17 and 18, for example, a plurality of (256 in this example) row selection lines RL coupled to the row selection line driver (RLD) 231S and a plurality of (256 in this example) row selection lines RL coupled to the row selection line driver (RLD) 233S are alternately provided side by side in one region, and a plurality of (256 in this example) column selection lines CL coupled to the column selection line driver (CLD) 241S and a plurality of (256 in this example) column selection lines CL coupled to the column selection line driver (CLD) 243S are alternately provided side by side in one region, unlike a case of the present embodiment (FIG. 8), the definition of the memory array AR becomes complicated, which may cause the operation of the memory section 20S to become complicated.

In contrast, in the memory section 20 according to the present embodiment, for example, a plurality of (512 in this example) row selection lines RL coupled to the row selection line driver (RLD) 231 are provided side by side in one region, and a plurality of (512 in this example) column selection lines CL coupled to the column selection line driver (CLD) 241 are provided side by side in one region. This makes it possible to simplify the definition of the memory array AR in the semiconductor device 1, as illustrated in FIG. 8, which makes it possible to simplify the operation of the memory section 20.

Consequently, in the semiconductor device 1, it is possible to achieve a storage device having high area efficiency.

[Effects]

As described above, in the present embodiment, the row selection lines having a predetermined width are formed to extend in the X direction and be disposed side by side in the Y direction in a region other than a plurality of openings in the row selection line region, and the column selection lines having a predetermined width are formed to extend in the Y direction and be disposed side by side in the X direction in a region other than a plurality of openings in the column selection line region, which makes it possible to enhance yield.

In the present embodiment, the row selection line is coupled to the row selection line driver through the metal wiring line formed above the row selection line, and the column selection line is coupled to the column selection line driver through the metal wiring line formed above the column selection line. Specifically, in the present embodiment, the via VRL having a tapered shape is used to couple the metal wiring line and the row selection line to each other, and the via VCL having a tapered shape is used to couple the metal wiring line and the column selection line to each other. This makes it possible to enhance yield.

In the present embodiment, a plurality of openings is provided in the row selection line region, and a via is provided in each of the openings, which makes it possible to couple the metal wiring line formed above the row selection line to the row selection line driver formed below the row selection line. Similarly, a plurality of openings is provided in the column selection line region, and a via is provided in each of the openings, which makes it possible to couple the metal wiring line formed above the column selection to the column selection line driver formed below the column selection line.

In the present embodiment, since a plurality of row selection lines coupled to the row selection line driver is provided side by side in one region, a plurality of row selection lines coupled to the row selection line driver is provided side by side in one region, a plurality of column selection lines coupled to the column selection line driver is provided side by side in one region, and a plurality of column selection lines coupled to the column selection line driver is provided side by side in one region, which makes it possible to simplify the operation of the memory section.

Modification Example 1-1

In the foregoing embodiment, a single wiring layer LM4 is provided above the selection line layers LRL and LCL, but this is not limitative. For example, a plurality of wiring layers may be provided instead of the single wiring layer LM4. In this case, for example, it is possible to increase a degree of freedom of wiring that couples the row selection line RL and the via V3 formed in the opening ORL to each other, which makes it possible to reduce the coupling regions 171 and 172, and it is possible to increase a degree of freedom of wiring that couples the column selection line CL and the via V3 formed in the opening OCL to each other, which makes it possible to reduce the coupling regions 181 and 182. Consequently, it is possible to enhance area efficiency.

Modification Example 1-2

In the foregoing embodiment, one storage layer is provided, but this is not limitative. For example, two or more storage layers may be provided instead of one storage layer. A semiconductor device 1A including two storage layers will be described in detail below.

The semiconductor device 1A includes a memory section 40. The memory section 40 includes a plurality of row selection line drivers (RLD) 43 (row selection line drivers (RLD) 431 and 432) and a plurality of column selection line drivers (CLD) 44 (column selection line drivers (CLD) 441 and 442) as in the semiconductor device 1 (FIG. 2) according to the foregoing embodiment. The plurality of row selection line drivers (RLD) 43 and the plurality of column selection line drivers (CLD) 44 are arranged in a checkerboard fashion.

FIG. 19 illustrates a configuration example of the memory section 40. The memory section 40 includes a plurality of row selection lines RL (row selection lines RL0 and RL1), a plurality of column selection lines CL, and a plurality of memory cells MC (memory cells MC0 and MC1).

A plurality of row selection lines RL0 is formed to extend in the X direction and be disposed side by side in the Y direction in the X-Y plane parallel to the substrate surface S of the semiconductor substrate. The plurality of column selection lines CL is formed to extend in the Y direction and be disposed side by side in the X direction in the X-Y plane. A plurality of row selection lines RL1 is formed to extend in the X direction and be disposed side by side in the Y direction in the X-Y plane. The plurality of column selection lines CL is formed in a layer above a layer in which the plurality of row selection lines RL0 is formed, and the plurality of row selection lines RL1 is formed in a layer above the layer in which the plurality of column selection lines CL is formed.

A plurality of memory cells MC (memory cells MC0) is formed in a storage layer between the layer in which the plurality of row selection lines RL0 is formed and the layer in which the plurality of column selection lines CL is formed. Similarly, a plurality of memory cells MC (memory cells MC1) is formed in a layer between the layer in which the plurality of column selection lines CL is formed and a storage layer in which the plurality of row selection lines RL1 is formed.

As illustrated in FIG. 4, the memory cells MC0 and MC1 have the storage element VR and the selection element SE. In the memory cells MC0, the terminal TU is coupled to one of the plurality of column selection lines CL, and the terminal TL is coupled to one of the plurality of row selection lines RL0. Similarly, in the memory cells MC1, the terminal TU is coupled to one of the plurality of row selection lines RL1, and the terminal TL is coupled to one of the plurality of column selection lines CL. Thus, as illustrated in FIG. 19, in the memory cells MC, the storage element VR is formed above the selection element SE regardless of which of the storage layers the memory cells MC are formed in.

FIG. 20 illustrates an example of coupling between the row selection line RL0 and the row selection line driver (RLD) 43. FIG. 21 illustrates an example of coupling between the row selection line RL1 and the row selection line driver (RLD) 43. FIG. 22 illustrates an example of coupling between the column selection line CL and the column selection line driver (CLD) 44.

The memory section 40 includes three selection line layers LRL0, LCL, and LRL1. The selection line layer LRL0 is a wiring layer in which the row selection line RL0 is formed, the selection line layer LCL is a wiring layer in which the column selection line CL is formed, and the selection line layer LRL1 is a wiring layer in which the row selection line RL1 is formed.

As illustrated in FIG. 20, the row selection line RL0 and the row selection line driver (RLD) 43 are coupled to each other through a coupling section 33A. The coupling section 33A includes a contact CT that couples a transistor TR of the row selection line driver (RLD) 43 and the metal wiring line M1 to each other, the metal wiring line M1, the via V1 between the wiring layers LM1 and LM2, the metal wiring line M2, the via V2 between the wiring layers LM2 and LM3, the metal wiring line M3, the via V3 between the wiring layers LM3 and LM4, the metal wiring line M4, and a via VRL0 between the metal wiring line M4 and the row selection line RL0. The via VRL0 has a so-called tapered shape similarly to the via VRL according to the foregoing first embodiment.

As illustrated in FIG. 21, the row selection line RL1 and the row selection line driver (RLD) 43 are coupled to each other through a coupling section 33B. The coupling section 33B includes the contact CT that couples the transistor TR of the row selection line driver (RLD) 43 and the metal wiring line M1, the metal wiring line M1, the via V1 between the wiring layers LM1 and LM2, the metal wiring line M2, the via V2 between the wiring layers LM2 and LM3, the metal wiring line M3, the via V3 between the wiring layers LM3 and LM4, the metal wiring line M4, and a via VRL1 between the metal wiring line M4 and the row selection line RL1. The via VRL1 has a so-called tapered shape similarly to the via VRL according to the foregoing first embodiment.

As illustrated in FIG. 22, the column selection line CL and the column selection line driver (CLD) 44 are coupled to each other through a coupling section 34. The coupling section 34 includes the contact CT that couples the transistor TR of the column selection line driver (CLD) 44 and the metal wiring line M1 to each other, the metal wiring line M1, the via V1 between the wiring layers LM1 and LM2, the metal wiring line M2, the via V2 between the wiring layers LM2 and LM3, the metal wiring line M3, the via V3 between the wiring layers LM3 and LM4, the metal wiring line M4, the via VCL between the metal wiring line M4 and the column selection line CL.

FIG. 23 illustrates an example of the row selection line RL0. FIG. 24 illustrates an example of the row selection line RL1. Lengths of the row selection lines RL0 and RL1 are about twice a length of the row selection line RL according to the foregoing first embodiment.

The plurality of row selection line drivers (RLD) 431 includes row selection line drivers (RLD) 431A and row selection line drivers (RLD) 431B. The row selection line drivers (RLD) 431A drive a plurality of row selection lines RL0, and the row selection line drivers (RLD) 431B drive a plurality of row selection line RL1. The row selection line drivers (RLD) 431A and 431B are alternately disposed with the column selection line drivers (CLD) 441 interposed therebetween in the X direction. Similarly, the plurality of row selection line drivers (RLD) 432 includes row selection line drivers (RLD) 432A and row selection line drivers (RLD) 432B. The row selection drivers (RLD) 432A drive a plurality of row selection lines RL0, and the row selection line drivers (RLD) 432B drive a plurality of row selection lines RL1. The row selection line drivers (RLD) 432A and 432B are alternately disposed with the column selection line drivers (CLD) 442 interposed therebetween in the X direction.

As illustrated in FIG. 23, each of the plurality of row selection lines RL0 is coupled to the coupling section 33A (a coupling section 331A or 332A) in the vicinity of the middle in an extending direction (X direction) of the row selection line RL0. In addition, each of the row selection line drivers (RLD) 431A is coupled to the coupling section 331A in the vicinity of the middle in the X direction of the row selection line driver (RLD) 431A, and each of the row selection line drivers (RLD) 432A is coupled to the coupling section 332A in the vicinity of the middle in the X direction of the row selection line driver (RLD) 432A. Thus, the row selection line driver (RLD) 431A is coupled to a plurality of row selection lines RL0 through the coupling section 331A, and the row selection line driver (RLD) 432A is coupled to a plurality of row selection lines RL0 through the coupling section 332A.

One row selection line driver (RLD) 431A is coupled to a plurality of (512 in this example) row selection lines RL0, for example. In FIG. 23, right-side ends of these row selection lines RL0 coupled to the row selection line driver (RLD) 431A are located in the vicinity of the middle in the X direction of the row selection line driver (RLD) 431B located on the right of the row selection line driver (RLD) 431A. In addition, left-side ends of these row selection lines RL0 coupled to the row selection line driver (RLD) 431A are located in the vicinity of the middle in the X direction of the row selection line driver (RLD) 431B located on the left of the row selection line driver (RLD) 431A.

Similarly, one row selection line driver (RLD) 432A is coupled to a plurality of (512 in this example) row selection lines RL0, for example. In FIG. 23, right-side ends of these row selection lines RL0 coupled to the row selection line driver (RLD) 432A are located in the vicinity of the middle in the X direction of the row selection line driver (RLD) 432B located on the right of the row selection line driver (RLD) 432A. In addition, left-side ends of the row selection lines RL0 coupled to the row selection line driver (RLD) 432A are located in the vicinity of the middle in the X direction of the row selection line driver (RLD) 432B located on the left of the row selection line driver (RLD) 432A.

As illustrated in FIG. 24, each of the plurality of row selection lines RL1 is coupled to a coupling section 33B (a coupling section 331B or 332B) in the vicinity of the middle in an extending direction (X direction) of the row selection line RL1. In addition, each of the row selection line drivers (RLD) 431B is coupled to the coupling section 331B in the vicinity of the middle in the X direction of the row selection line driver (RLD) 431B, and each of the row selection line drivers (RLD) 432B is coupled to the coupling section 332B in the vicinity of the middle in the X direction of the row selection line driver (RLD) 432B. Thus, the row selection line driver (RLD) 431B is coupled to a plurality of row selection lines RL1 through the coupling section 331B, and the row selection line driver (RLD) 432B is coupled to a plurality of row selection lines RL1 through the coupling section 332B.

One row selection line driver (RLD) 431B is coupled to a plurality of (512 in this example) row selection lines RL1, for example. In FIG. 24, right-side ends of these row selection lines RL1 coupled to the row selection line driver (RLD) 431B are located in the vicinity of the middle in the X direction of the row selection line driver (RLD) 431A located on the right of the row selection line driver (RLD) 431B. In addition, left-side ends of these row selection lines RL1 coupled to the row selection line driver (RLD) 431B are located in the vicinity of the middle in the X direction of the row selection line driver (RLD) 431A located on the left of the row selection line driver (RLD) 431B.

Similarly, one row selection line driver (RLD) 432B is coupled to a plurality of (512 in this example) row selection lines RL1, for example. In FIG. 24, right-side ends of these row selection lines RL1 coupled to the row selection line driver (RLD) 432B are located in the vicinity of the middle in the X direction of the row selection line driver (RLD) 432A located on the right of the row selection line driver (RLD) 432B. In addition, left-side ends of these row selection lines RL1 coupled to the row selection line driver (RLD) 432B are located in the vicinity of the middle in the X direction of the row selection line driver (RLD) 432A located on the left of the row selection line driver (RLD) 432B.

FIG. 25 illustrates an example of the column selection lines CL. The column selection lines CL have a similar configuration to that of the column selection lines CL (FIG. 13) according to the foregoing first embodiment. The column selection line driver (CLD) 441 is coupled to a plurality of column selection lines CL through a coupling section 341, and the column selection line driver (CLD) 442 is coupled to a plurality of column selection lines CL through a coupling section 342.

FIG. 26 illustrates examples of a plurality of row selection lines RL0 and RL1 and a plurality of column selection lines CL. FIG. 26 illustrates superposition of the plurality of row selection lines RL0 and RL1 illustrated in FIGS. 23 and 24 and the plurality of column selection lines CL illustrated in FIG. 25.

Each of the plurality of row selection lines RL0 intersects with 2048 (=512×4) column selection lines CL in this example, and each of the plurality of column selection lines CL intersects with 1024 (=512×2) row selection lines RL0 in this example. Similarly, each of the plurality of row selection lines RL1 intersects with 2048 (=512×4) column selection lines CL in this example, and each of the plurality of column selection lines CL intersects with 1024 (=512×2) row selection lines RL1 in this example.

In the memory section 40, a memory array AR0 including 2M (=2048×1024) memory cells MC0 and a memory array AR1 including 2M (=2048×1024) memory cells MC1 are defined. As illustrated in FIG. 23, the memory array AR0 includes 512 row selection lines RL0 coupled to the row selection line driver (RLD) 431A, and 512 row selection lines RL0 coupled to the row selection line driver (RLD) 432A. As illustrated in FIG. 24, the memory array AR1 includes 512 row selection lines RL1 coupled to the row selection line driver (RLD) 431B, and 512 row selection lines RL1 coupled to the row selection line driver (RLD) 432B.

It is possible to configure the coupling section 33A (coupling sections 331A and 332A), the coupling section 33B (coupling sections 331B and 332B), and the coupling section 34 (coupling sections 341 and 342) similarly to the coupling section 13 (coupling sections 131 and 132) and the coupling section 14 (coupling sections 141 and 142) according to the foregoing first embodiment.

2. Second Embodiment

Next, a semiconductor device 2 according to a second embodiment will be described. The present embodiment differs from the foregoing first embodiment in a configuration of the coupling section that couples the row selection lines RL and the row selection line driver to each other, and a configuration of the coupling section that couples the column selection lines CL and the column selection line driver to each other. It is to be noted that components substantially the same as those of the semiconductor device 1 according to the foregoing first embodiment are denoted by the same reference numerals, and descriptions thereof are omitted as appropriate.

The semiconductor device 2 includes a memory section 60. The memory section 60 includes a plurality of row selection line drivers (RLD) 63 (row selection line drivers (RLD) 631 and 632) and a plurality of column selection line drivers (CLD) 64 (column selection line drivers (CLD) 641 and 642) as in the semiconductor device 1 (FIG. 2) according to the foregoing embodiment. The row selection line drivers (RLD) 631 and 632 respectively correspond to the row selection line drivers (RLD) 231 and 232 according to the foregoing first embodiment, and the column selection line drivers (CLD) 641 and 642 respectively correspond to the column selection line drivers (CLD) 241 and 242 according to the foregoing first embodiment. The plurality of row selection line drivers (RLD) 63 and the plurality of column selection line drivers (CLD) 64 are arranged in a checkerboard fashion.

(Coupling Sections 531 and 532)

As in the semiconductor device 1 according to the foregoing first embodiment (FIG. 8), the row selection lines RL to be driven by the row selection line driver (RLD) 631 are coupled to the row selection line driver (RLD) 631 through a coupling section 531, and the row selection lines RL to be driven by the row selection line driver (RLD) 632 are coupled to the row selection line driver (RLD) 632 through a coupling section 532. In addition, as in the semiconductor device 1 (FIG. 9), the row selection lines RL coupled to the coupling section 531 are formed in the row selection line region 151, and the coupling section 531 is formed in the coupling region 171. The row selection lines RL coupled to the coupling section 532 are formed in the row selection line region 152, and the coupling section 532 is formed in the coupling region 172. Hereinafter, the coupling section 531 will be described as an example, but the same applies to the coupling section 532.

FIG. 27 illustrates an example of a layout pattern of the coupling region 171. A pattern PAT2 illustrated in FIG. 27 corresponds to the pattern PAT1 (FIG. 10) according to the foregoing first embodiment. FIG. 28 illustrates a pattern PAT2A in a left half of the pattern PAT2, and FIG. 29 illustrates a pattern PAT2B in a right half of the pattern PAT2. In this pattern PAT2, 64 row selection lines RL are coupled to the row selection line driver 631.

The row selection lines RL are formed to extend in the X direction and be disposed side by side in the Y direction in a region other than the plurality of openings ORL in the row selection line region 151 as in the foregoing first embodiment. In this example, the pitch of the row selection lines RL is 2F. In this example, the minimum processing dimension F is 10 nm, which is a half of the minimum processing dimension F in the case of the foregoing first embodiment. That is, the pitch of the row selection lines RL are 20 nm. The pitch corresponds to a case where the width of the row selection line RL is F (10 nm in this example) and an interval between adjacent ones of the row selection lines RL is F (10 nm in this example).

In the semiconductor device 2, as in the semiconductor device 1 according to the foregoing first embodiment, a plurality of vias V3 is formed in each of the openings ORL to penetrate the selection line layer LRL. Each of the vias V3 is coupled to the metal wiring line M4 of the wiring layer LM4. Thus, the metal wiring line M4 is coupled to the top surface of the row selection line RL through the via VRL. In addition, the via V3 is coupled to the row selection line driver (RLD) 631 formed on the semiconductor substrate.

The metal wiring line M4 is routed in the wiring layer LM4 to couple the row selection line RL and the via V3 to each other, as illustrated in FIG. 27. The minimum pitch of the metal wiring line M4 is 8F (80 nm in this example). The minimum pitch corresponds to a case where the width of the metal wiring line M4 is 4F (40 nm in this example) and an interval between adjacent ones of the metal wiring lines M4 is 4F (40 nm in this example). This minimum pitch is the same as that in the foregoing first embodiment.

In the example illustrated in FIG. 27, the pattern PAT2 is a pattern having a length of 448F (4480 nm in this example) in the X direction and a length of 128F (1280 nm in this example) in the Y direction. The minimum pitch of the via V3 is 8F (80 nm in this example), The minimum pitch of the via VRL is 8F (80 nm in this example).

(Coupling Sections 541 and 542)

As in the semiconductor device 1 according to the foregoing first embodiment (FIG. 13), the column selection lines CL to be driven by the column selection line driver (CLD) 641 are coupled to the column selection line driver (CLD) 641 through the coupling section 541, and the column selection lines CL to be driven by the column selection line driver (CLD) 642 are coupled to the column selection line driver (CLD) 642 through the coupling section 542. In addition, as in the semiconductor device 1 (FIG. 14), the column selection lines CL coupled to the coupling section 541 are formed in the column selection line region 161, and the coupling section 541 is formed in the coupling region 181. The column selection lines CL coupled to the coupling section 542 are formed in the column selection line region 162, and the coupling section 542 is formed in the coupling region 182. Hereinafter, the coupling section 541 will be described as an example, but the same applies to the coupling section 532.

As a layout pattern of the coupling region 181, for example, it is possible to use a layout pattern similar to the layout pattern of the coupling region 171 (FIG. 27), except that the row selection lines RL are replaced with the column selection lines CL. The column selection lines CL are formed to extend in the Y direction and be disposed side by side in the X direction in a region other than the plurality of openings OCL in the column selection line region 161. In each of the openings OCL, a plurality of vias V3 is formed to penetrate the selection line layer LCL. Each of the vias V3 is coupled to the metal wiring line M4 of the wiring layer LM4. Thus, the metal wiring line M4 is coupled to the top surface of the column selection line CL through the via VCL. In addition, the via V3 is coupled to the column selection line driver 641 formed on the semiconductor substrate.

As described above, in the semiconductor device 2, the pitch of the row selection line RL is halved and the pitch of the column selection line CL is halved as compared with the semiconductor device 1, which makes it possible to increase the number of memory cells MC per unit area. Even in this case, the length in the X direction of the pattern PAT2 is 4480 nm, which is slightly longer than the length (3520 nm) in the X direction of the pattern PAT1 according to the foregoing first embodiment. This makes it possible to achieve a storage device having high area efficiency in the semiconductor device 2.

Modification Example 2-1

Each of the modification examples of the foregoing first embodiment may be applied to the semiconductor device 2 according to the foregoing embodiment.

3. Third Embodiment

Next, a semiconductor device 3 according to a third embodiment will be described. The present embodiment differs from the foregoing first embodiment in the configuration of the coupling section that couples the row selection lines RL and the row selection line driver to each other, and the configuration of the coupling section that couples the column selection lines CL and the column selection line driver to each other. It is to be noted that components substantially the same as those of the semiconductor device 1 according to the foregoing first embodiment are denoted by the same reference numerals, and descriptions thereof are omitted as appropriate.

The semiconductor device 3 includes a memory section 80. The memory section 80 includes a plurality of row selection line drivers (RLD) 83 (row selection line drivers (RLD) 831 and 832) and a plurality of column selection line drivers (CLD) 84 (column selection line drivers (CLD) 841 and 842) as in the semiconductor device 1 (FIG. 2) according to the foregoing embodiment. The row selection line drivers (RLD) 831 and 832 respectively correspond to the row selection line drivers (RLD) 231 and 232 according to the foregoing first embodiment, and the column selection line drivers (CLD) 841 and 842 respectively correspond to the column selection line drivers (CLD) 241 and 242 according to the foregoing first embodiment. The plurality of row selection line drivers (RLD) 83 and the plurality of column selection line drivers (CLD) 84 are arranged in a checkerboard fashion.

(Coupling Sections 731 and 732)

As in the semiconductor device 1 according to the foregoing first embodiment (FIG. 8), the row selection lines RL to be driven by the row selection line driver (RLD) 831 are coupled to the row selection line driver (RLD) 831 through a coupling section 731, and the row selection lines RL to be driven by the row selection line driver (RLD) 832 are coupled to the row selection line driver (RLD) 832 through a coupling section 732. In addition, as in the semiconductor device 1 (FIG. 9), the row selection lines RL coupled to the coupling section 731 are formed in the row selection line region 151, and the coupling section 731 is formed in the coupling region 171. The row selection lines RL coupled to the coupling section 732 are formed in the row selection line region 152, and the coupling section 732 is formed in the coupling region 172. Hereinafter, the coupling section 731 will be described as an example, but the same applies to the coupling section 732.

FIG. 30 illustrates an example of a layout pattern of the coupling region 171. A pattern PAT3 illustrated in FIG. 30 corresponds to the pattern PAT1 (FIG. 10) according to the foregoing first embodiment. In this pattern PAT3, 32 row selection lines RL are coupled to the row selection line driver 831.

The row selection lines RL are formed to extend in the X direction and be disposed side by side in the Y direction in a region other than the plurality of openings ORL in the row selection line region 151 as in the foregoing first embodiment. In this example, the pitch of the row selection lines RL is 2F. In this example, the minimum processing dimension F is 20 nm, which is the same as that in the foregoing first embodiment. That is, the pitch of the row selection lines RL is 40 nm. The pitch corresponds to a case where the width of the row selection line RL is F (20 nm in this example) and an interval between adjacent ones of the row selection lines RL is F (20 nm in this example).

In the semiconductor device 3, as in the semiconductor device 1 according to the foregoing first embodiment, a plurality of vias V3 is formed in each of the openings ORL to penetrate the selection line layer LRL. Each of the vias V3 is coupled to the metal wiring line M4 of the wiring layer LM4. Thus, the metal wiring line M4 is coupled to the top surface of the row selection line RL through the via VRL. In addition, the via V3 is coupled to the row selection line driver (RLD) 831 formed on the semiconductor substrate.

The metal wiring line M4 is routed in the wiring layer LM4 to couple the row selection line RL and the via V3 to each other, as illustrated in FIG. 30. The minimum pitch of the metal wiring line M4 is 4F (80 nm in this example). The minimum pitch corresponds to a case where the width of the metal wiring line M4 is 2F (40 nm in this example) and an interval between adjacent ones of the metal wiring lines M4 is 2F (40 nm in this example). This minimum pitch is the same as that in the foregoing first embodiment.

In the example illustrated in FIG. 30, the pattern PAT3 is a pattern having a length of 128F (2560 nm in this example) in the X direction and a length of 64F (1280 nm in this example) in the Y direction. The minimum pitch of the via V3 is 4F (80 nm in this example). The minimum pitch in the X direction of the via VRL is 6F (120 nm in this example), and the minimum pitch in the Y direction of the via VRL is 4F (80 nm in this example). As described above, in the semiconductor device 3, it is possible to make the width (128F) in the X direction of the pattern PAT3 narrower than that (176F) in the semiconductor device 1.

As in the first embodiment (FIG. 8), each of the row selection line drivers (RLD) 831 is coupled to the coupling section 731 in the vicinity of the middle in the X direction of the row selection line driver (RLD) 831. Accordingly, in the row selection line driver (RLD) 831, it is possible to couple 256 wiring lines to the coupling section 731 from the left of the coupling section 731 and couple 256 wiring lines to the coupling section 731 from the right of the coupling section 731 in the wiring layers LM1 to LM3.

FIG. 31 schematically illustrates coupling to the coupling section 731 in the row selection line driver (RLD) 831. In this example, wiring lines related to sixteen row selection lines RL on lower side of thirty two row selection lines RL included in the pattern PAT3 are schematically illustrated. In the wiring layer LM1 to LM3, eight row selection lines RL of the sixteen row selection lines RL are coupled from the left of the coupling section 731, and the remaining eight row selection lines RL are coupled from the right of the coupling section 731. In the pattern PAT3, as illustrated in FIG. 31, up to ten wiring lines are disposed in the wiring layer LM1 to LM3 below the sixteen row selection lines RL. In this case, a maximum value of line density of the wiring lines is 10 lines/32F. As described above, the maximum value of the linear density is higher than that in the first embodiment (8 lines/32F). Accordingly, in the semiconductor device 3, while a degree of freedom of layout becomes lower as compared with the semiconductor device 1 according to the first embodiment, it is possible to enhance area efficiency, as will be described later.

(Coupling Sections 741 and 742)

As in the semiconductor device 1 according to the foregoing first embodiment (FIG. 13), the column selection lines CL to be driven by the column selection line driver (CLD) 841 are coupled to the column selection line driver (CLD) 841 through the coupling section 741, and the column selection lines CL to be driven by the column selection line driver (CLD) 842 are coupled to the column selection line driver (CLD) 842 through the coupling section 742. In addition, as in the semiconductor device 1 (FIG. 14), the column selection lines CL coupled to the coupling section 741 are formed in the column selection line region 161, and the coupling section 741 is formed in the coupling region 181. The column selection lines CL coupled to the coupling section 742 are formed in the column selection line region 162, and the coupling section 742 is formed in the coupling region 182. Hereinafter, the coupling section 741 will be descried as an example, but the same applies to the coupling section 742.

As a layout pattern of the coupling region 181, for example, it is possible to use a layout pattern similar to the layout pattern of the coupling region 171 (FIG. 30), except that the row selection lines RL are replaced with the column selection lines CL.

The column selection lines CL are formed to extend in the Y direction and be disposed side by side in the X direction in a region other than the plurality of openings OCL in the column selection line region 161. In each of the openings OCL, a plurality of vias V3 is formed to penetrate the selection line layer LCL. Each of the via V3 is coupled to the metal wiring line M4 of the wiring layer LM4. Thus, the metal wiring line M4 is coupled to the top surface of the column selection line CL through the via VCL. In addition, the via V3 is coupled to the column selection line driver (CLD) 841 formed on the semiconductor substrate. The same applies to the coupling section 742.

As described above, in semiconductor device 3, for example, it is possible to make a width (128F) in the X direction of the pattern PAT3 in the X direction narrower than that (176F) in the semiconductor device 1, which makes it possible to make the coupling regions 171, 172, 181, and 182 smaller. This makes it possible to achieve a storage device having high area efficiency in the semiconductor device 3.

Modification Example 3-1

Each of the modification examples of the foregoing first embodiment may be applied to the semiconductor device 3 according to the foregoing embodiment.

Although the present technology has been described with reference to some embodiments and modification examples, the technology is not limited to these embodiments and the like, and may be modified in a variety of ways.

For example, layer configurations, the number of row selection lines RL, the number of column selection lines CL, and the like in the foregoing embodiments and the like are examples, and may be changed as appropriate.

It is to be noted that the effects described herein are merely illustrative and not limitative, and other effects may be provided.

It is to be noted that the present technology may have the following configurations.

(1)

A semiconductor device including:

a plurality of first selection lines provided in a region other than a plurality of opening regions in a first region in a first selection line layer, and having a predetermined width, the plurality of first selection lines extending in a first direction and disposed side by side in a second direction, the second direction intersecting with the first direction;

a first metal wiring line formed in a layer above the first selection line layer;

a first through wiring line penetrating an insulating layer formed on the first selection line layer, and coupling a first line of the plurality of first selection lines and the first metal wiring line to each other;

a second through wiring line provided in a first opening region of the plurality of opening regions, and penetrating the first selection line layer, the second through wiring line having one end coupled to the first metal wiring line;

a first storage element having a first terminal, and a second terminal coupled to the first line; and a first drive circuit that is coupled to another end of the second through wiring line, and drives the plurality of first selection lines.

(2)

The semiconductor device according to (1), in which the first through wiring line is thinner toward the first selection line layer and thicker away from the first selection line layer.

(3)

The semiconductor device according to (1) or (2), in which the predetermined width is narrower than a wiring width of the first metal wiring line.

(4)

The device according to any one of (1) to (3), further including:

a second metal wiring line formed in a layer above the first selection line layer;

a third through wiring line penetrating the insulating layer, and coupling a second line of the plurality of first selection lines and the second metal wiring line;

a fourth through wiring line provided in a second opening region of the plurality of opening regions and penetrating the first selection line layer, the fourth through wiring line having one end coupled to the second metal wiring line; and a second storage element having a first terminal, and a second terminal coupled to the second line, in which the first drive circuit is also coupled to another end of the fourth through wiring line, and the second opening region is disposed at a position different from the first opening region in the second direction.

(5)

The semiconductor device according to (4), in which the second opening region is disposed at a position different from the first opening region in the one direction.

(6)

The semiconductor device according to (4) or (5), in which the first metal wiring line and the second metal wiring line are formed in a single wiring layer provided above the first selection line layer.

(7)

The semiconductor device according to (4) or (5), in which the first metal wiring line and the second metal wiring line are formed in wiring layers different from each other.

(8)

The semiconductor device according to any one of (1) to (7), including:

a plurality of second selection lines provided in a region other than a plurality of opening regions in a second region in a second selection line layer, and having a predetermined width, the plurality of second selection lines extending in the second direction and disposed side by side in the first direction, the plurality of opening regions including a third opening region, the second selection line layer being different from the first selection line layer;

a third metal wiring line formed in a layer above the second selection line layer;

a fifth through wiring line penetrating an insulating layer formed on the second selection line layer, and coupling a third line of the plurality of second selection lines and the third metal wiring line to each other;

a sixth through wiring line provided in the third opening region, and penetrating the second selection line layer, the sixth through wiring line having one end coupled to the third metal wiring line; and a second drive circuit that is coupled to another end of the sixth through wiring line, and drives the plurality of second selection lines, in which the first terminal of the first storage element is coupled to the third line.

(9)

The semiconductor device according to (8), in which the first metal wiring line and the third metal wiring line are formed in a single wiring layer provided above the first selection line layer.

This application claims the benefit of Japanese Priority Patent Application JP2017-105367 filed with the Japan Patent Office on May 29, 2017, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A semiconductor device, comprising:
   a plurality of first selection lines in a first region in a first selection line layer;
   a plurality of first opening regions in a second region in the first selection line layer, wherein
      the first region is different from the second region,
      each of the plurality of first selection lines has a first width,
      each of the plurality of first selection lines extends in a first direction,
      a first selection line of the plurality of first selection lines is adjacent to a second selection line of the plurality of first selection lines in a second direction, and
      the second direction intersects with the first direction;
   a first metal wiring line in a first layer above the first selection line layer;
   a first through wiring line, wherein
      the first through wiring line penetrates a first insulating layer on the first selection line layer,
      a first end of the first through wiring line is coupled to the first selection line,
      a second end of the first through wiring line is coupled to the first metal wiring line, and
      a thickness of the first through wiring line decreases from the second end coupled to the first metal wiring line to the first end coupled to the first selection line;
   a second through wiring line in a first opening region of the plurality of first opening regions;
   a third through wiring line in a second opening region of the plurality of first opening regions, wherein
      each of the second through wiring line and the third through wiring line penetrates the first selection line layer, and
      a first end of the second through wiring line is coupled to the first metal wiring line;
   a first storage element that comprises a first terminal and a second terminal,
      wherein the second terminal of the first storage element is coupled to the first selection line; and
   a first drive circuit coupled to a second end of the second through wiring line,
      wherein the first drive circuit is configured to drive the plurality of first selection lines.

2. The semiconductor device according to claim 1, wherein the first width of each of the plurality of first selection lines is narrower than a wiring width of the first metal wiring line.

3. The semiconductor device according to claim 1, further comprising:
   a second metal wiring line formed in a second layer above the first selection line layer;
   a fourth through wiring line, wherein
      the fourth through wiring line penetrates the first insulating layer on the first selection line layer,
      the fourth through wiring line couples the second selection line of the plurality of first selection lines and the second metal wiring line, and
      a first end of the third through wiring line is coupled to the second metal wiring line; and
   a second storage element that comprises a first terminal and a second terminal, wherein
      the second terminal of the second storage element is coupled to the second selection line,
      the first drive circuit is coupled to a second end of the third through wiring line, and the second opening region is at a position different from the first opening region in the second direction.

4. The semiconductor device according to claim 3, wherein the first metal wiring line and the second metal wiring line are in a single wiring layer above the first selection line layer.

5. The semiconductor device according to claim 3, wherein the first layer is different from the second layer.

6. The semiconductor device according to claim 1, further comprising:
    a plurality of second selection lines in a third region in a second selection line layer;
    a plurality of second opening regions in a fourth region in the second selection line layer, wherein
        each of the plurality of second selection lines has a second width,
        each of the plurality of second selection lines extends in the second direction,
        a first selection line of the plurality of second selection lines is adjacent to a second selection line of the plurality of second selection lines in the first direction,
        the second selection line layer is different from the first selection line layer, and
        the plurality of second opening regions includes a third opening region;
    a second metal wiring line in a second layer above the second selection line layer;
    a fourth through wiring line, wherein
        the fourth through wiring line penetrates a second insulating layer on the second selection line layer, and
        the fourth through wiring line couples a third selection line of the plurality of second selection lines and the second metal wiring line;
    a fifth through wiring line in the third opening region, wherein
        the fifth through wiring line penetrates the second selection line layer, and
        a first end of the fifth through wiring line is coupled to the second metal wiring line; and
    a second drive circuit coupled to a second end of the fifth through wiring line, wherein
        the second drive circuit is configured to drive the plurality of second selection lines, and
        the first terminal of the first storage element is coupled to the third selection line.

7. The semiconductor device according to claim 6, wherein the first metal wiring line and the second metal wiring line are in a single wiring layer above the first selection line layer.

* * * * *